(12) United States Patent
Tsai et al.

(10) Patent No.: US 10,825,721 B2
(45) Date of Patent: Nov. 3, 2020

(54) INSULATING CAP ON CONTACT STRUCTURE AND METHOD FOR FORMING THE SAME

(71) Applicant: Taiwan Semiconductor Manufacturing Co., Ltd., Hsinchu (TW)

(72) Inventors: Kuo-Chiang Tsai, Hsinchu (TW); Fu-Hsiang Su, Zhubei (TW); Ke-Jing Yu, Kaohsiung (TW); Jyh-Huei Chen, Hsinchu (TW)

(73) Assignee: TAIWAN SEMICONDUCTOR MANUFACTURING CO., LTD., Hsinchu (TW)

( * ) Notice: Subject to any disclaimer, the term of this patent is extended or adjusted under 35 U.S.C. 154(b) by 0 days.

(21) Appl. No.: 16/180,913

(22) Filed: Nov. 5, 2018

(65) Prior Publication Data

US 2020/0126843 A1    Apr. 23, 2020

Related U.S. Application Data

(60) Provisional application No. 62/749,347, filed on Oct. 23, 2018.

(51) Int. Cl.
*H01L 21/768* (2006.01)
*H01L 29/66* (2006.01)
(Continued)

(52) U.S. Cl.
CPC .... *H01L 21/7682* (2013.01); *H01L 21/76802* (2013.01); *H01L 21/76831* (2013.01);
(Continued)

(58) Field of Classification Search
CPC ............ H01L 29/6656; H01L 29/6653; H01L 29/4991; H01L 29/41775; H01L 29/66795;
(Continued)

(56) References Cited

U.S. PATENT DOCUMENTS 8,772,109 B2   7/2014  Colinge
8,785,285 B2   7/2014  Tsai et al.
(Continued)

*Primary Examiner* — Dao H Nguyen
(74) *Attorney, Agent, or Firm* — Birch, Stewart, Kolasch & Birch, LLP

(57) ABSTRACT

A semiconductor device structure is provided. The semiconductor device structure includes a gate stack formed over a semiconductor substrate, a source/drain contact structure laterally adjacent to the gate stack, and a gate spacer formed between the gate stack and the source/drain contact structure. The semiconductor device structure also includes a first insulating capping feature covering the upper surface of the gate stack, a second insulating capping feature covering the upper surface of the source/drain contact structure, and an insulating layer covering the upper surfaces of the first insulating capping feature and the second insulating capping feature. The second insulating capping feature includes a material that is different from the material of the first insulating capping feature. The semiconductor device structure also includes a via structure passing through the insulating layer and the first insulating capping feature and electrically connected to the gate stack.

20 Claims, 16 Drawing Sheets

(51) Int. Cl.
 *H01L 29/49* (2006.01)
 *H01L 29/417* (2006.01)
 *H01L 29/78* (2006.01)

(52) U.S. Cl.
 CPC .... *H01L 29/41775* (2013.01); *H01L 29/4991* (2013.01); *H01L 29/6653* (2013.01); *H01L 29/6656* (2013.01); *H01L 29/66545* (2013.01); *H01L 29/66795* (2013.01); *H01L 29/41791* (2013.01); *H01L 29/785* (2013.01)

(58) Field of Classification Search
 CPC ............ H01L 29/66545; H01L 29/785; H01L 29/41791; H01L 21/7682; H01L 21/76802; H01L 21/76831
 USPC ............... 257/386, 288, 347, 522, 751, 401, 257/E29.018, E29.135, E29.152, E21.158, 257/E21.409, E21.573, E21.581, E21.658, 257/E23.144, E23.161, E27.06, E27.087; 438/586, 595, 151, 291, 381
 See application file for complete search history.

(56) References Cited

U.S. PATENT DOCUMENTS

| | | | |
|---|---|---|---|
| 8,816,444 | B2 | 8/2014 | Wann et al. |
| 8,823,065 | B2 | 9/2014 | Wang et al. |
| 8,860,148 | B2 | 10/2014 | Hu et al. |
| 9,105,490 | B2 | 8/2015 | Wang et al. |
| 9,236,267 | B2 | 1/2016 | De et al. |
| 9,236,300 | B2 | 1/2016 | Liaw |
| 9,520,482 | B1 | 12/2016 | Chang et al. |
| 9,576,814 | B2 | 2/2017 | Wu et al. |
| 9,716,158 | B1* | 7/2017 | Cheng ................ H01L 29/4991 |
| 9,721,897 | B1* | 8/2017 | Cheng .............. H01L 21/28247 |
| 10,211,092 | B1* | 2/2019 | Cheng .............. H01L 29/66795 |
| 10,522,649 | B2* | 12/2019 | Cheng .............. H01L 29/41791 |
| 10,529,826 | B1* | 1/2020 | Frougier ........... H01L 29/42372 |
| 2018/0204927 | A1* | 7/2018 | Chanemougame ........................ H01L 29/4991 |

\* cited by examiner

INSULATING CAP ON CONTACT STRUCTURE AND METHOD FOR FORMING THE SAME

PRIORITY CLAIM AND CROSS-REFERENCE

This application claims the benefit of U.S. Provisional Application No. 62/749,347, filed on Oct. 23, 2018, and entitled "Insulating cap on contact structure and method for forming the same", the entirety of which is incorporated by reference herein.

BACKGROUND

The semiconductor integrated circuit (IC) industry has experienced rapid growth. Technological advances in IC materials and design have produced generations of ICs where each generation has smaller and more complex circuits than the previous generation. As the semiconductor industry has progressed into nanometer technology process nodes in pursuit of higher device density, higher performance, and lower costs, challenges from both fabrication and design issues have resulted in the development of three-dimensional designs, such as the fin field effect transistor (FinFET).

FinFETs are fabricated with a thin vertical "fin" (or fin structure) extending from a substrate. The advantages of a FinFET include a reduction of the short-channel effect and a higher current flow.

Although existing FinFET manufacturing processes have generally been adequate for their intended purposes, they have not been entirely satisfactory in all respects, especially as device scaling-down continues. For example, it is a challenge to form reliable via and contact structures at smaller and smaller sizes.

BRIEF DESCRIPTION OF THE DRAWINGS

Aspects of the present disclosure are best understood from the following detailed description when read with the accompanying figures. It should be noted that, in accordance with standard practice in the industry, various features are not drawn to scale. In fact, the dimensions of the various features may be arbitrarily increased or reduced for clarity of discussion.

DETAILED DESCRIPTION

Figure 1A:
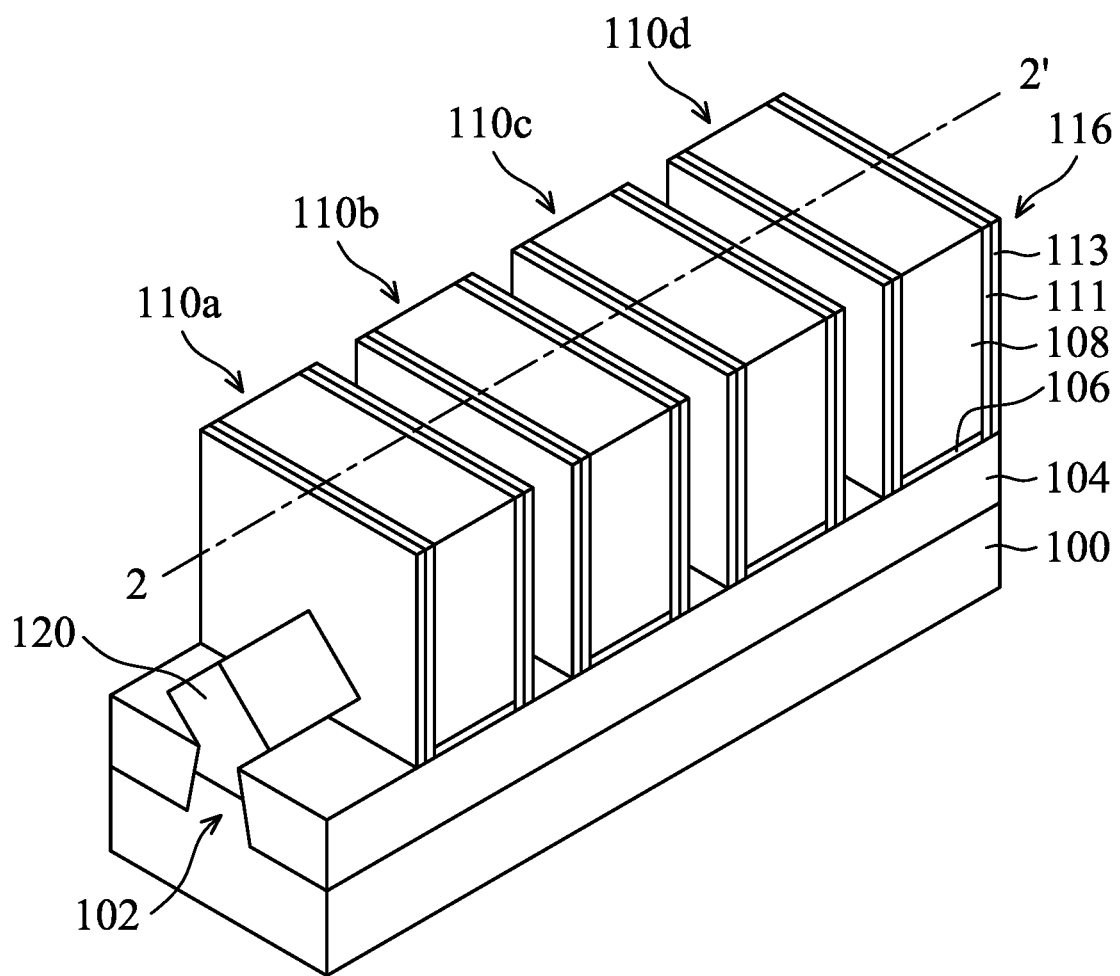
FIGS. 1A to 1D illustrate perspective views of various stages of manufacturing a semiconductor device structure in accordance with some embodiments.

The following disclosure provides many different embodiments, or examples, for implementing different features of the subject matter provided. Specific examples of components and arrangements are described below to simplify the present disclosure. These are, of course, merely examples and are not intended to be limiting. For example, the formation of a first feature over or on a second feature in the description that follows may include embodiments in which the first and second features are formed in direct contact, and may also include embodiments in which additional features may be formed between the first and second features, such that the first and second features may not be in direct contact. In addition, the present disclosure may repeat reference numerals and/or letters in the various examples. This repetition is for the purpose of simplicity and clarity and does not in itself dictate a relationship between the various embodiments and/or configurations discussed.

Furthermore, spatially relative terms, such as "beneath," "below," "lower," "above," "upper" and the like, may be used herein for ease of description to describe one element or feature's relationship to another element(s) or feature(s) as illustrated in the figures. The spatially relative terms are intended to encompass different orientations of the device in use or operation in addition to the orientation depicted in the figures. The apparatus may be otherwise oriented (rotated 90 degrees or at other orientations) and the spatially relative descriptors used herein may likewise be interpreted accordingly. It should be understood that additional operations can be provided before, during, and after the method, and some of the operations described can be replaced or eliminated for other embodiments of the method.

Embodiments for manufacturing semiconductor device structures are provided. The semiconductor device structures may include a gate stack and an adjacent source/drain contact structure over a semiconductor substrate. An insulating capping feature is formed over the source/drain contact structure and extends on an upper sidewall of the source/drain contact structure, so as to form an air gap between the gate stack and a lower sidewall of the source/drain contact structure. Afterwards, an insulating layer is formed over the gate stack and the insulating capping feature. The air gap reduces the capacitance of the parasitic capacitor formed between the gate stack and the contact structure. As a result, the device's performance can be improved. The insulating capping feature provides a hard mask property during forming a via opening above the gate stack, thereby preventing the source/drain contact structure from being bridged with the subsequently formed via structure over the gate stack. The insulating capping feature also provides etching selectivity from the insulating layer during the etching of a via opening in the insulating layer above the source/drain contact structure. Therefore, the formation of an etch stop layer between the insulating layer and the second insulating capping feature can be omitted. As a result, the etching capability for the definition of the via opening can be improved, and the height of the subsequently formed via structure over the source/drain contact structure can be reduced for reduction of the resistance of the via structures.

Figure 1B:
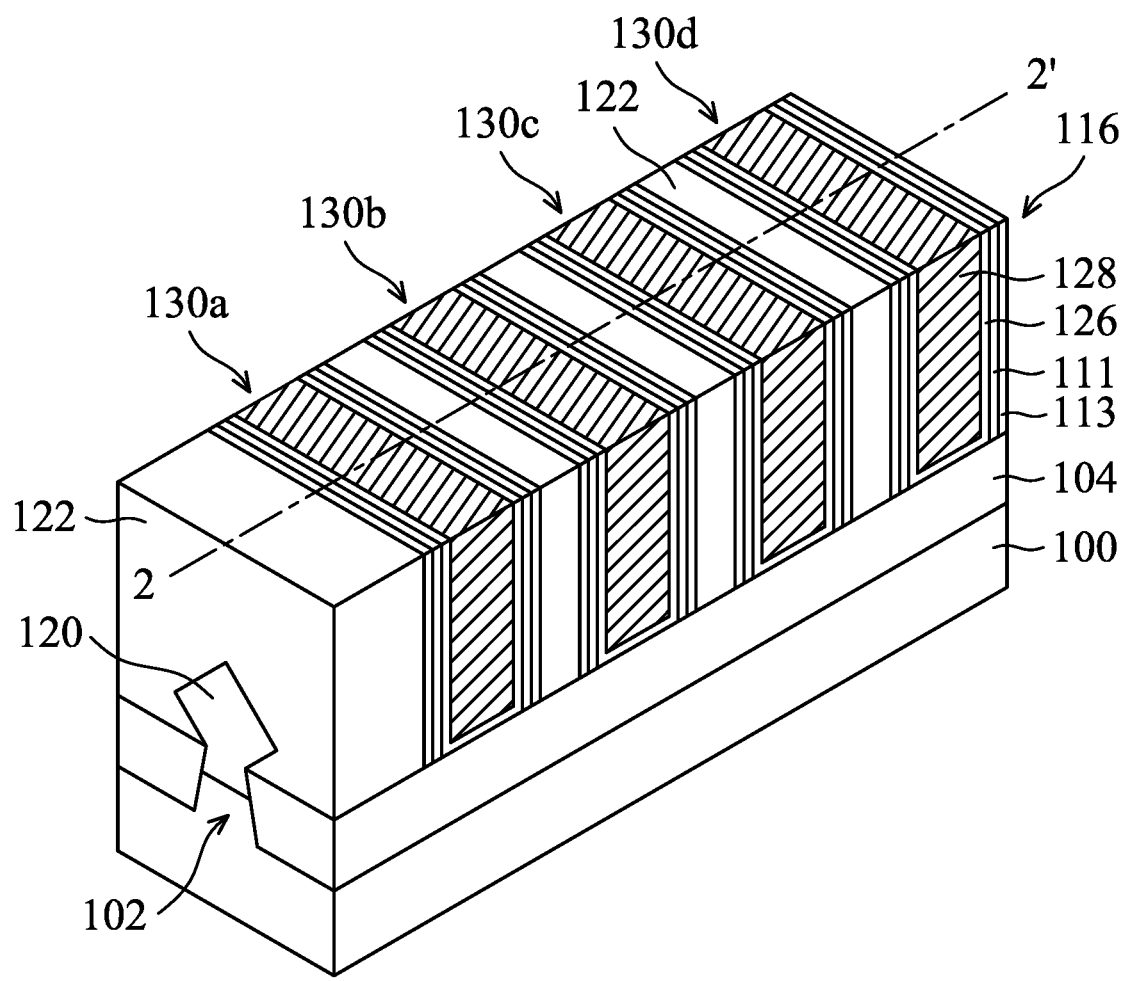
Figure 1C:
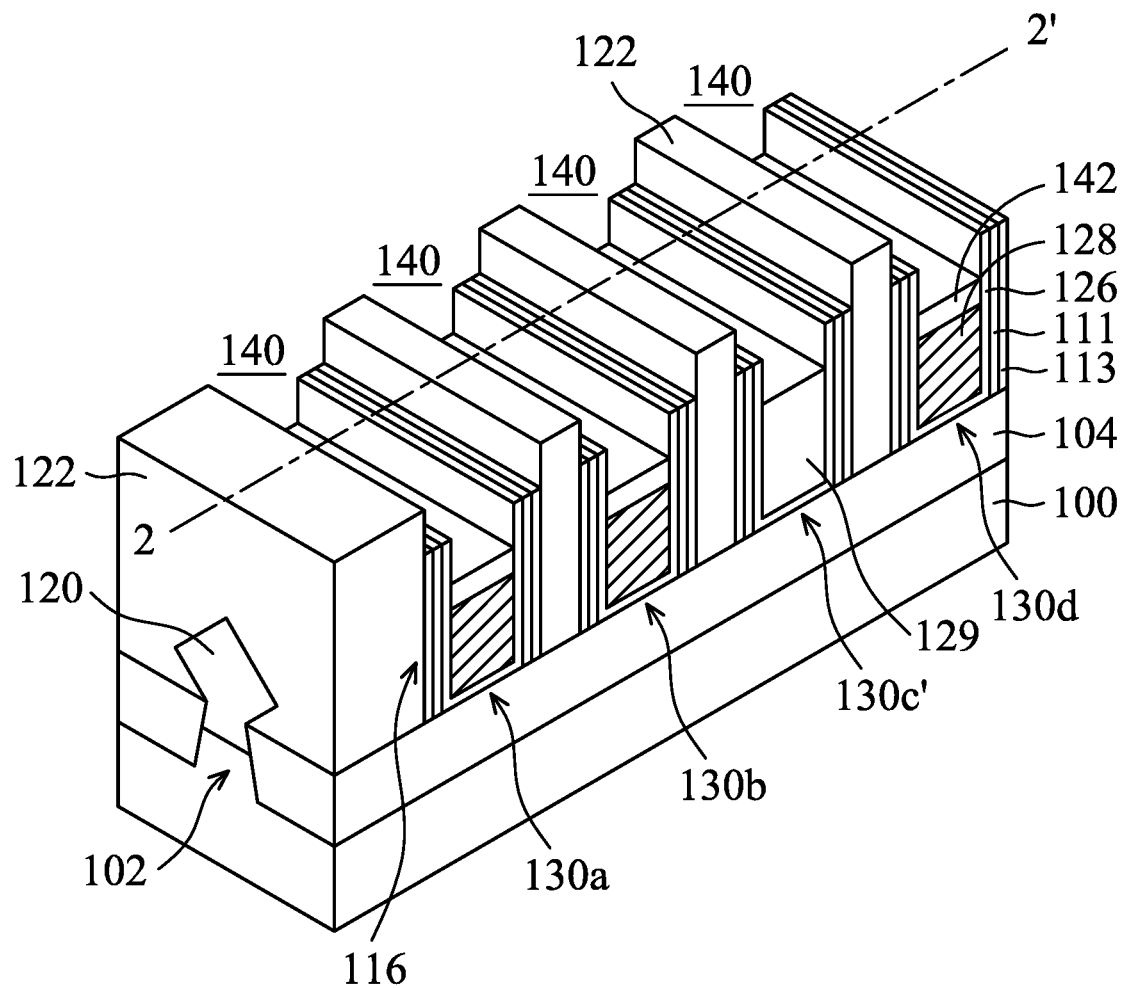
Figure 1D:
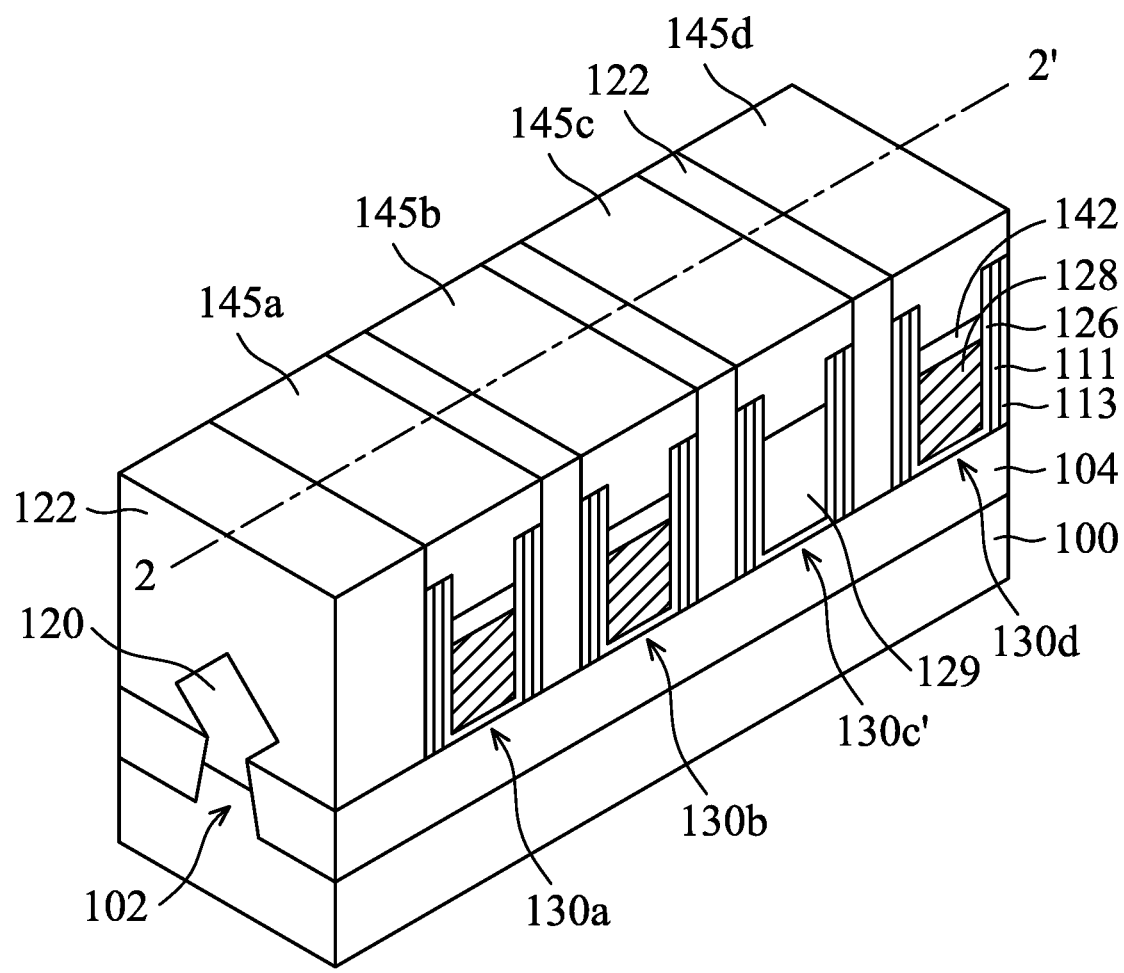
Figure 2A:
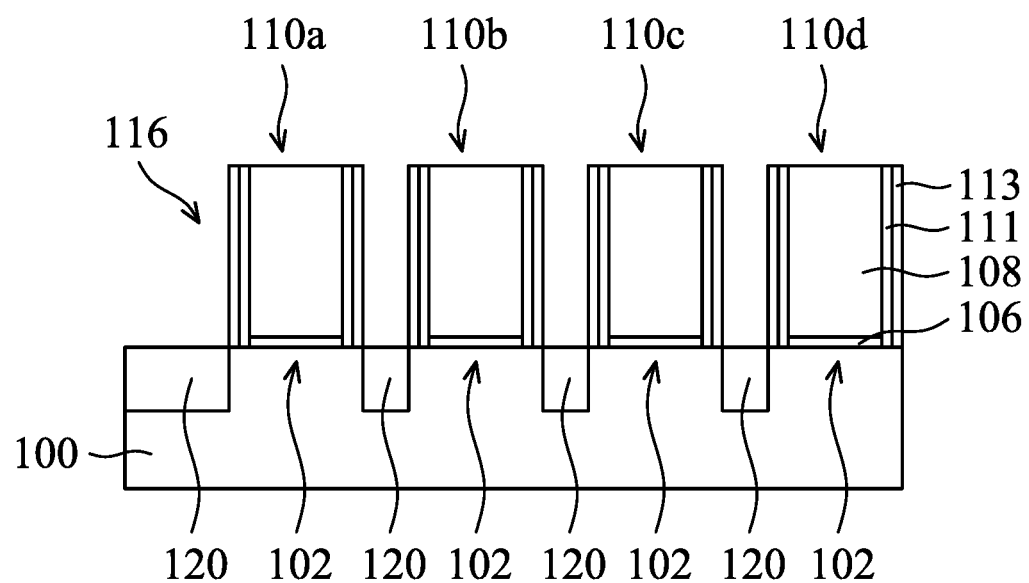
FIGS. 2A to 2R illustrate cross-sectional representations of various stages of manufacturing a semiconductor device structure in accordance with some embodiments.
Figure 2B:
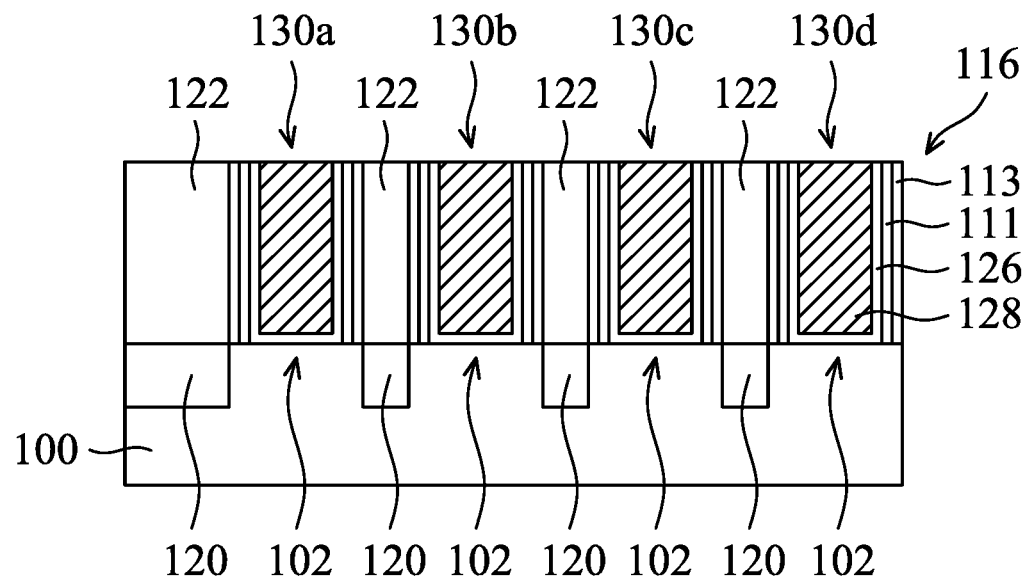
Figure 2C:
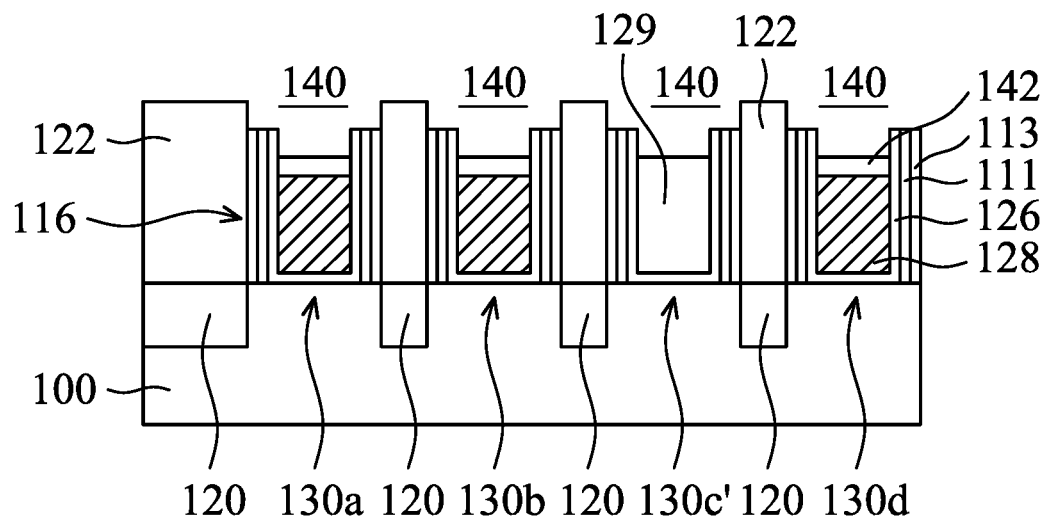
Figure 2D:
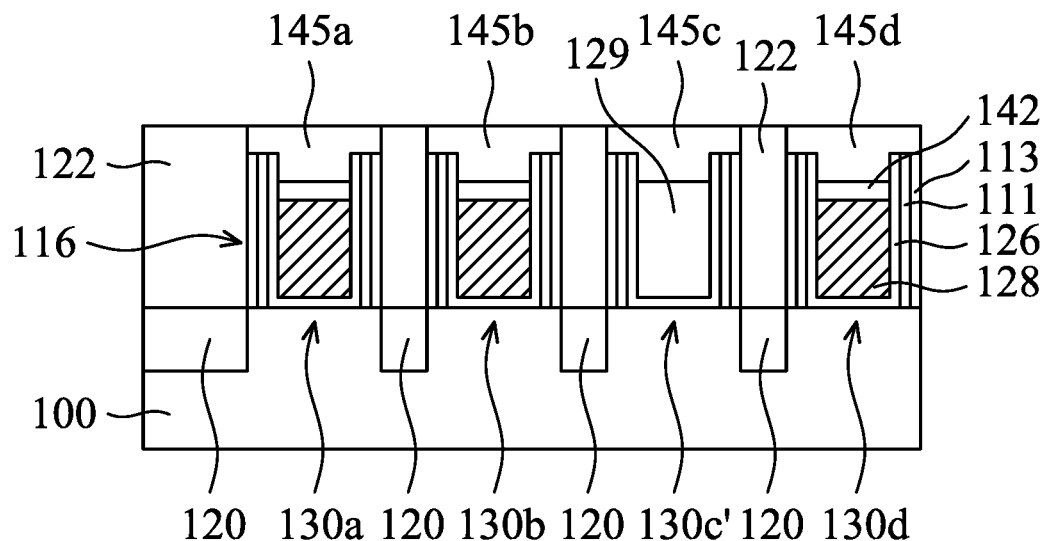
Figure 2E:
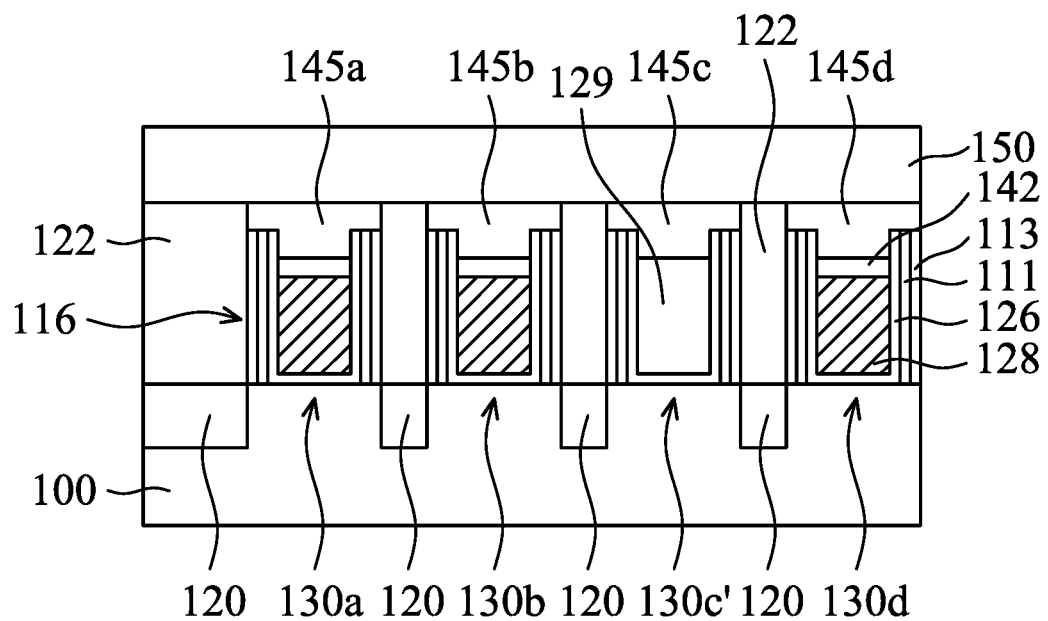
Figure 2F:
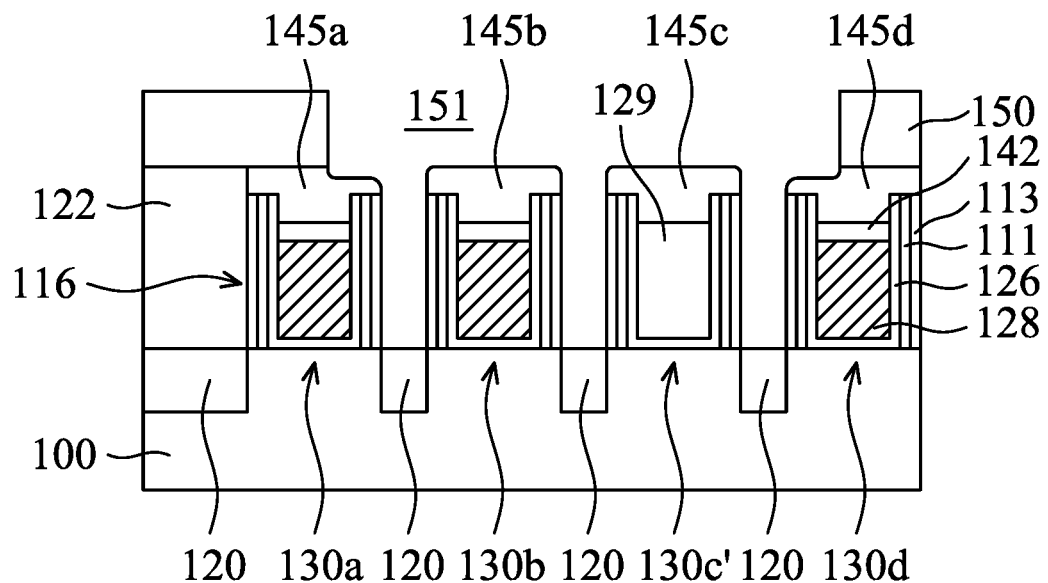
Figure 2G:
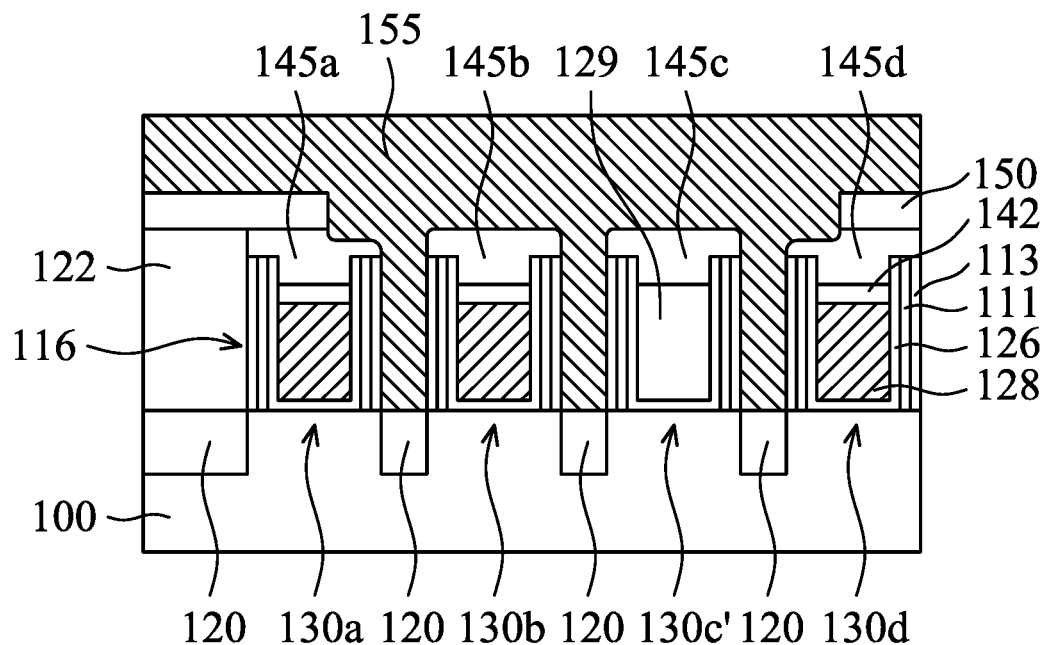
Figure 2H:
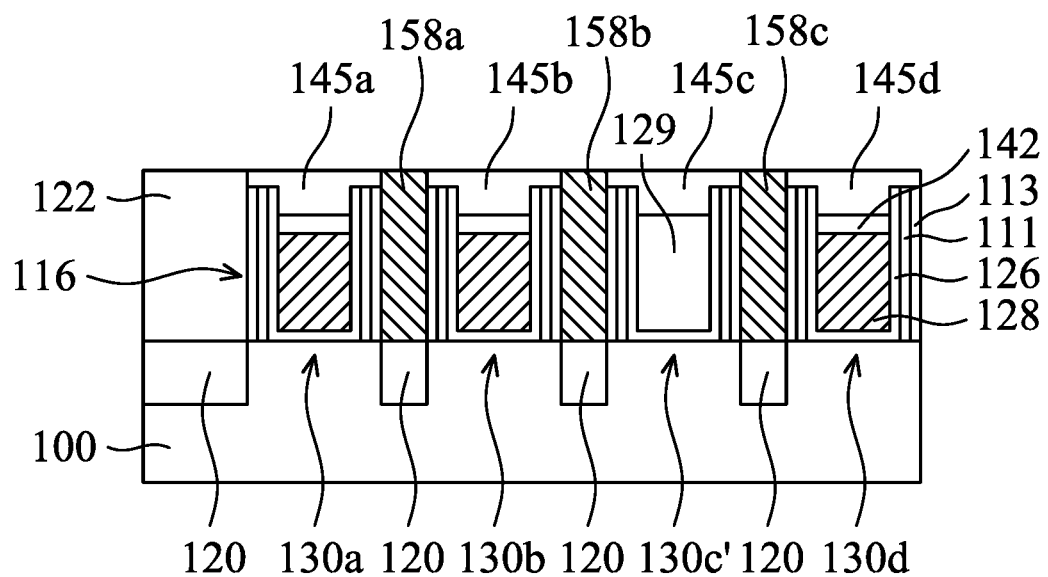
Figure 2I:
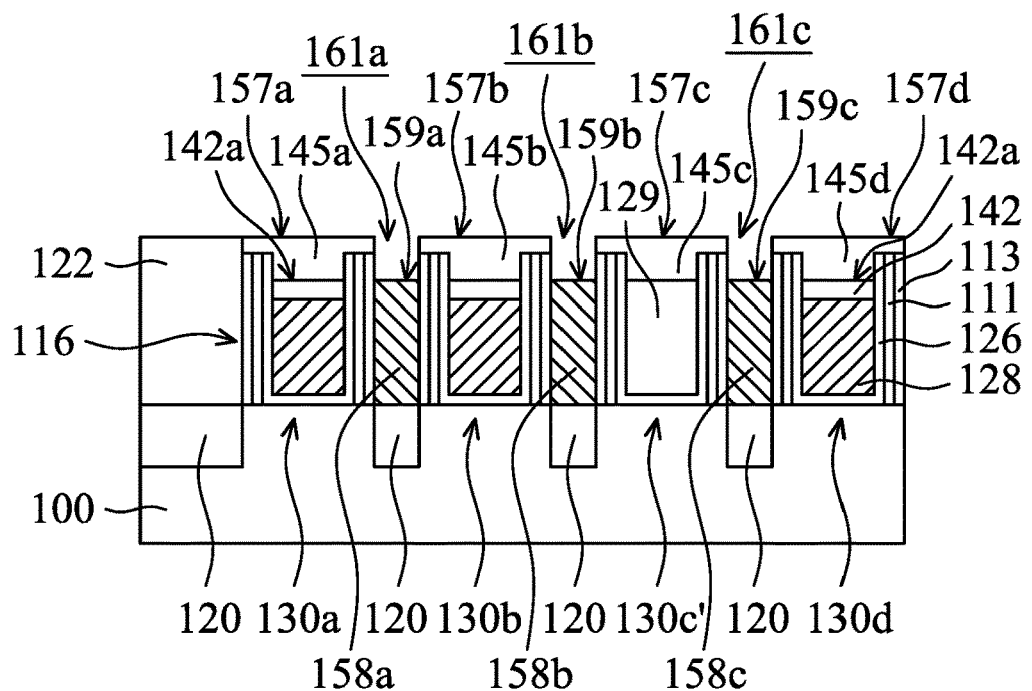
Figure 2J:
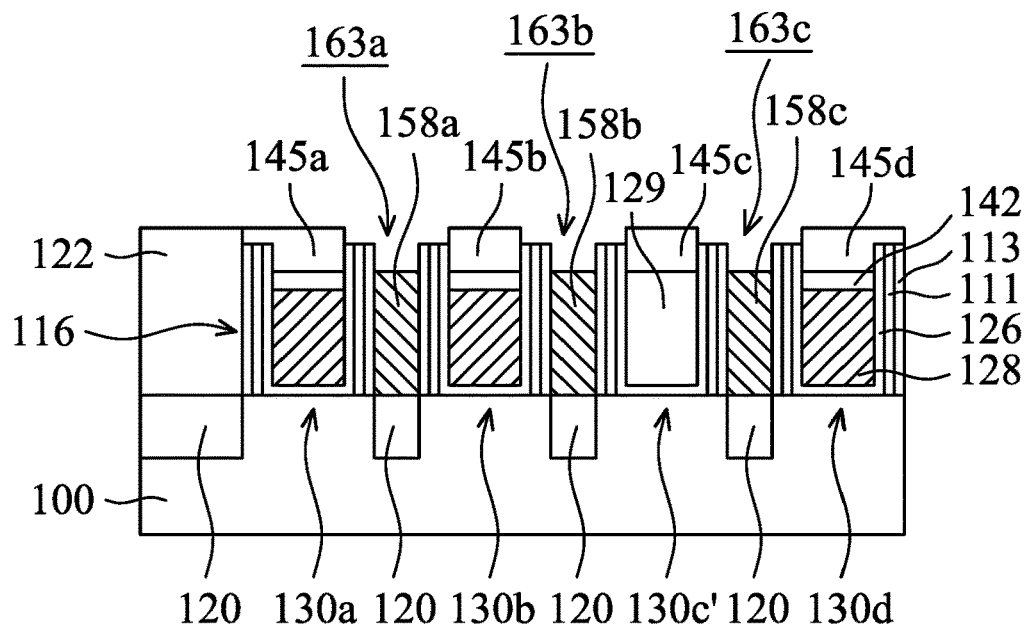
Figure 2K:
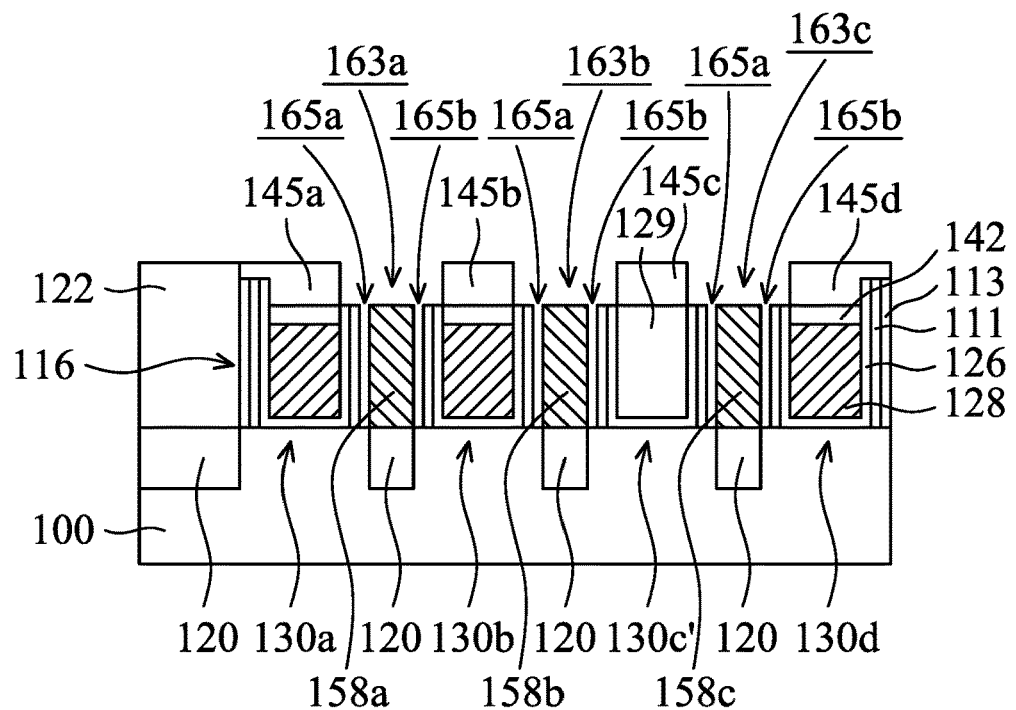
Figure 2L:
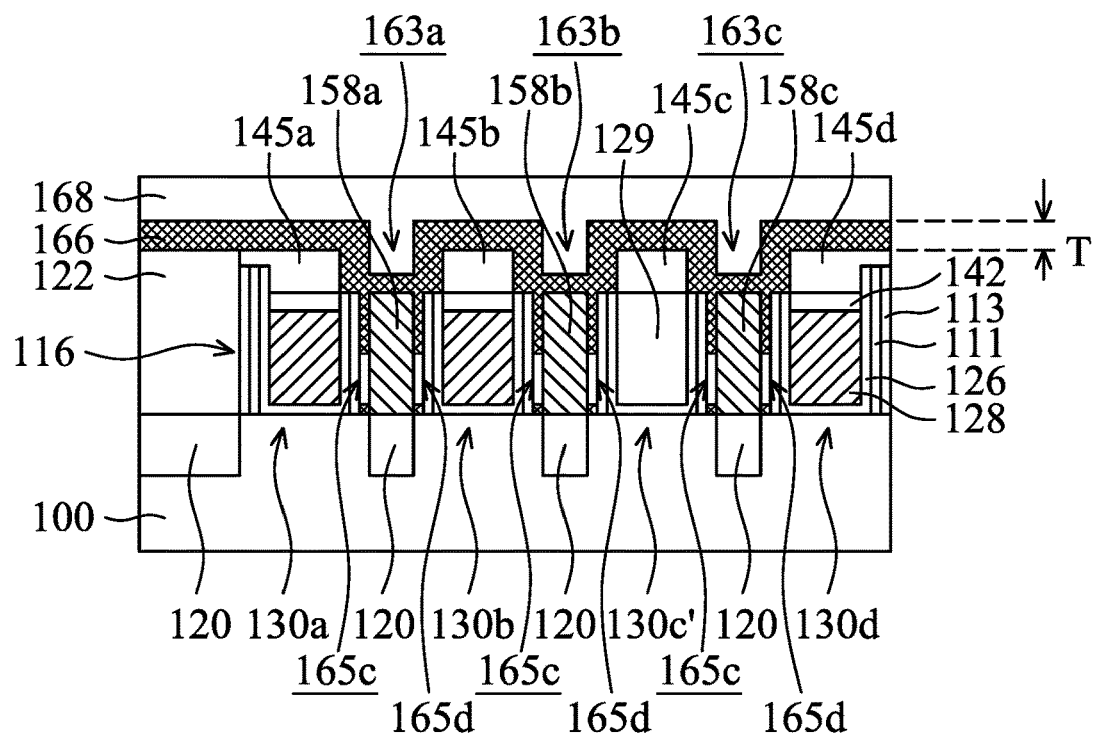
Figure 2M:
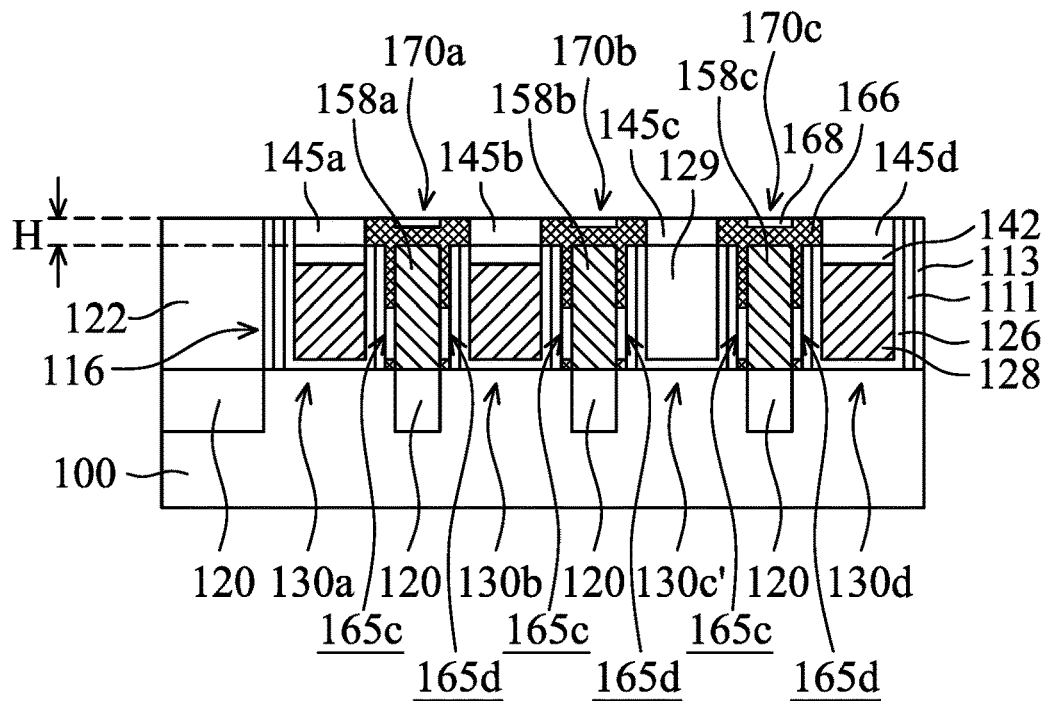
Figure 2N:
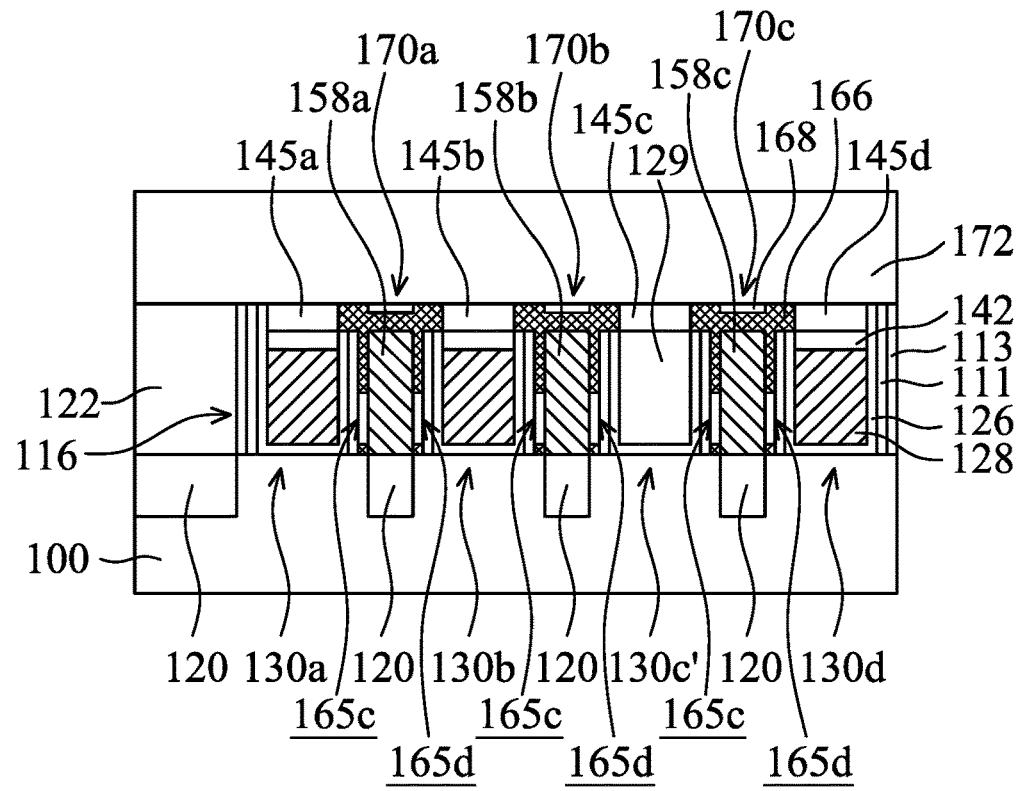
Figure 2O:
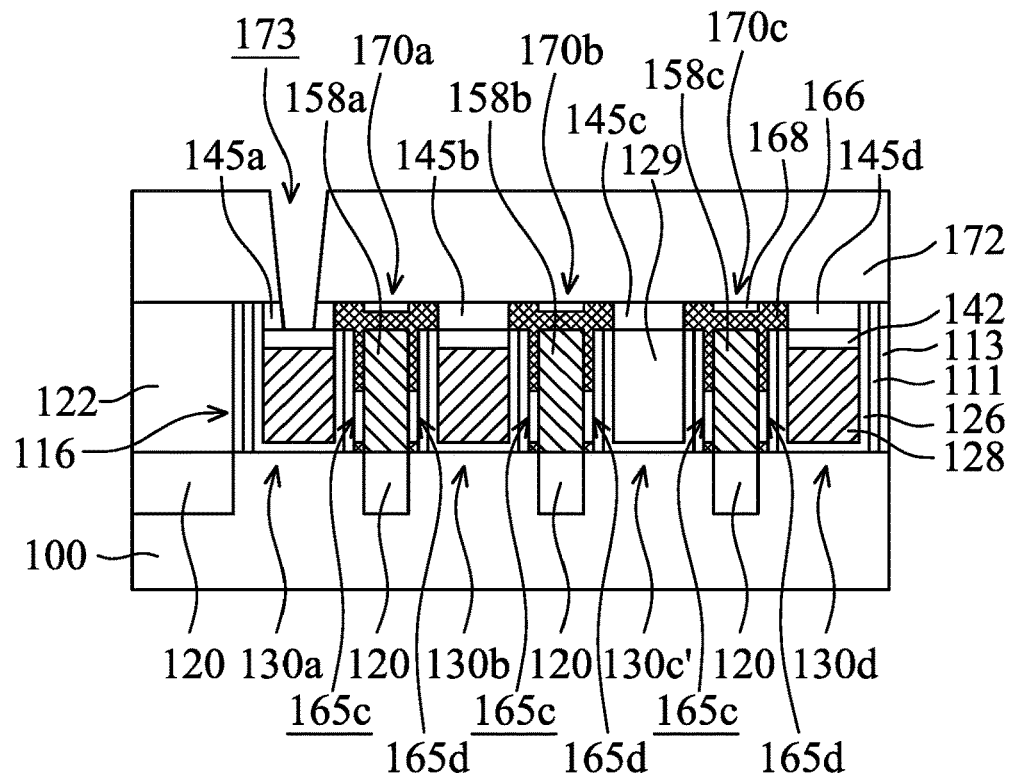
Figure 2P:
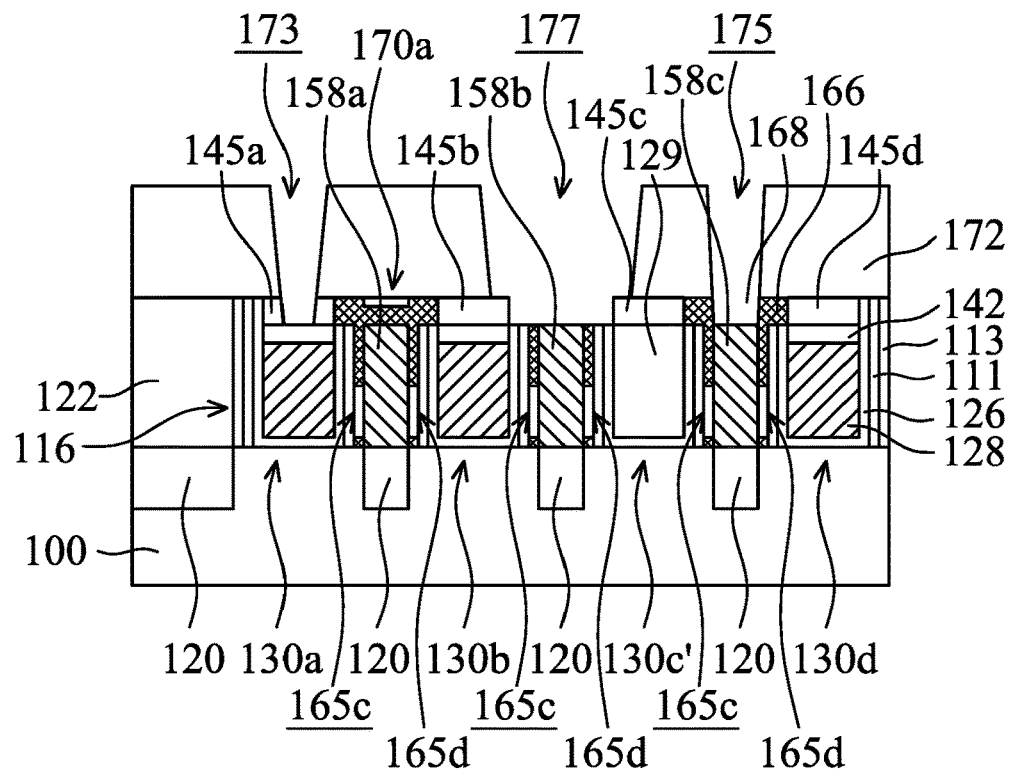
Figure 2Q:
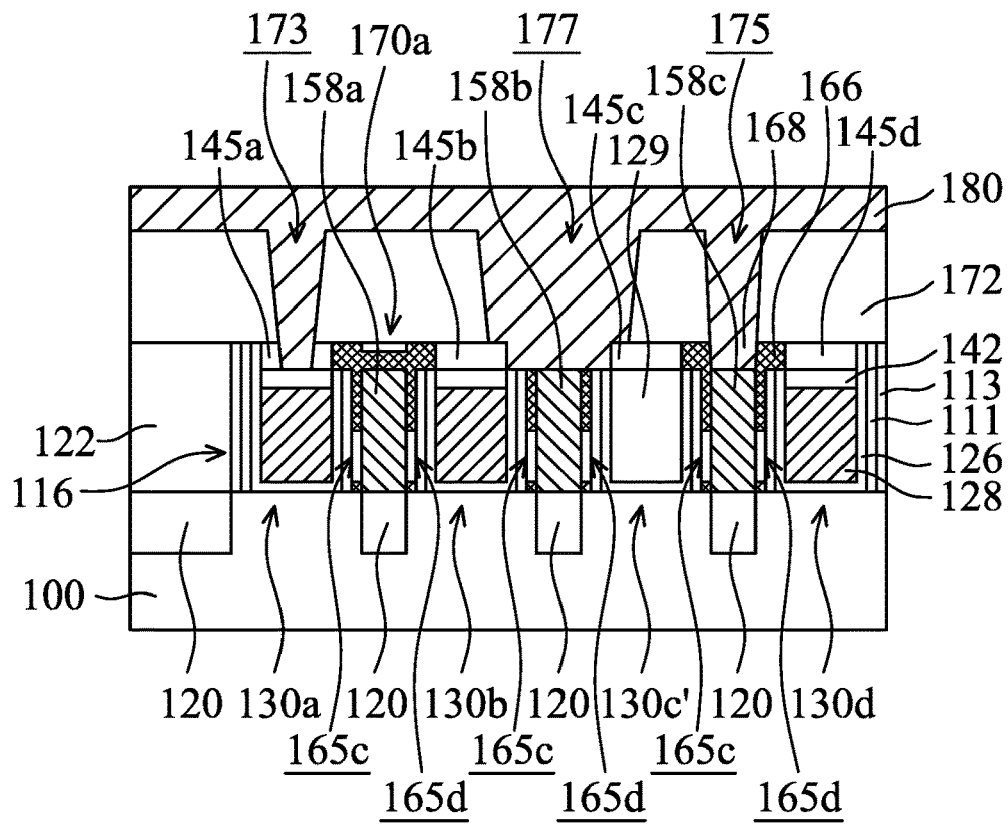
Figure 2R:
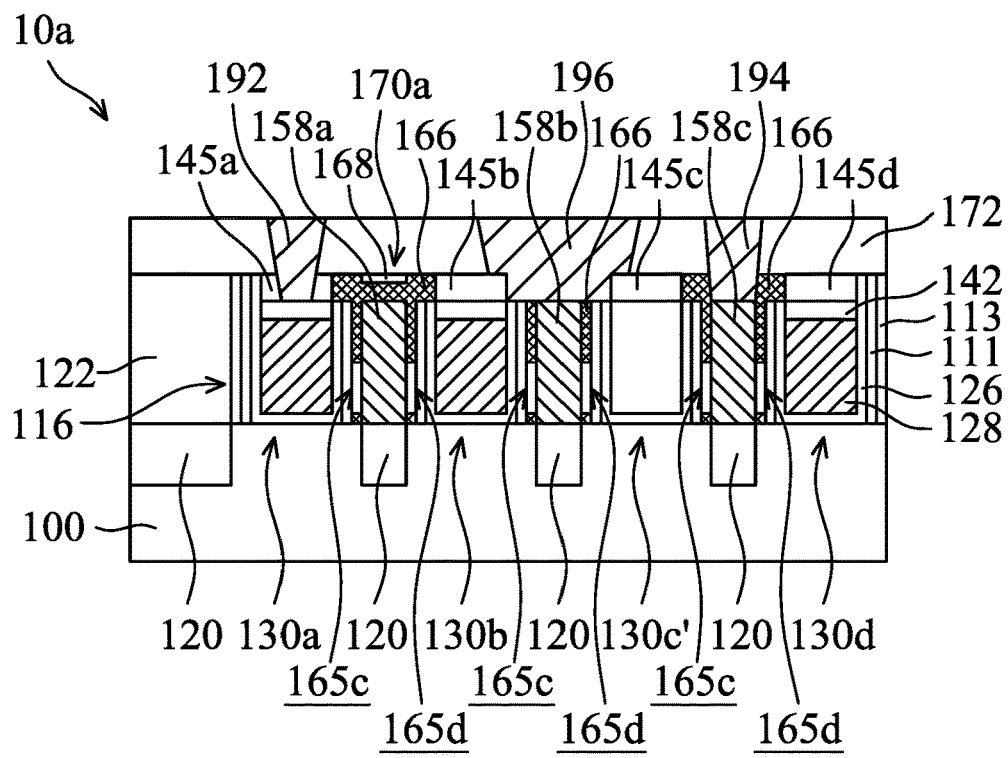

FIGS. 1A to 1D illustrate perspective views of various stages of manufacturing a semiconductor device structure and FIGS. 2A to 2R illustrate cross-sectional representations of various stages of manufacturing a semiconductor device structure in accordance with some embodiments. In addition, FIGS. 2A to 2D illustrate the cross-sectional representations of the semiconductor device structure shown along line 2-2' in FIGS. 1A to 1D in accordance with some embodiments. In some embodiments, the semiconductor device structure is implemented as a fin field effect transistor (FinFET) structure. As shown in FIGS. 1A and 2A, a substrate 100 is provided. In some embodiments, the substrate 100 is a semiconductor substrate, such as a bulk semiconductor, a semiconductor-on-insulator (SOI) substrate, or the like, which may be doped (e.g. with a P-type or an N-type dopant) or undoped. In some embodiments, the substrate 100 is a wafer, such as a silicon wafer. Generally, an SOI substrate includes a layer of a semiconductor material formed on an insulator layer. The insulator layer may be, for example, a buried oxide (BOX) layer, a silicon oxide layer, or the like. The insulator layer is provided on a substrate, typically a silicon or glass substrate.

Other substrates, such as a multi-layered or gradient substrate may also be used. In some embodiments, the semiconductor material of the substrate 100 includes silicon; germanium; a compound semiconductor including silicon carbide, gallium arsenic, gallium phosphide, indium phosphide, indium arsenide, and/or indium antimonide; an alloy semiconductor including SiGe, GaAsP, AlInAs, AlGaAs, GaInAs, GaInP, and/or GaInAsP; or a combination thereof. In some embodiments, the substrate 100 includes silicon. In some embodiments, the substrate 100 includes an epitaxial layer. For example, the substrate 100 has an epitaxial layer overlying a bulk semiconductor.

In some embodiments, the substrate 100 includes a PMOS region for P-type FinFETs formed thereon. The PMOS region of the substrate 100 may include Si, SiGe, SiGeB, or an III-V group semiconductor material (such as InSb, GaSb, or InGaSb). In some embodiments, the substrate 100 includes an NMOS region for N-type FinFETs formed thereon. The NMOS region of the substrate 100 may include Si, SiP, SiC, SiPC, or an III-V group semiconductor material (such as InP, GaAs, AlAs, InAs, InAlAs, or InGaAs). In some other embodiments, the substrate 100 includes the PMOS region and the NMOS region.

Afterwards, a fin structure 102 and an isolation feature 104 are successively formed over the substrate 100, as shown in FIG. 1A in accordance with some embodiments. In some embodiments, the substrate 100 is patterned to form the fin structure 102. The isolation feature 104 is a shallow trench isolation (STI) structure, and the fin structure 102 is surrounded by the isolation feature 104. The isolation feature 104 may be formed by depositing an insulating layer (not shown) over the substrate 100 and recessing the insulating layer. The insulating layer for the formation of the isolation feature 104 may be made of silicon oxide, silicon nitride, silicon oxynitride, fluorosilicate glass (FSG), low-K dielectric materials, and/or another suitable dielectric material and may be deposited by a flowable CVD (FCVD) process, a chemical vapor deposition (CVD) process, an atomic layer deposition (ALD) process, or another applicable process.

Afterwards, dummy gate structures 110a, 110b, 110c, and 110d are formed across the fin structure 102 over the substrate 100 to cover the isolation feature 104, as shown in FIG. 1A in accordance with some embodiments. Each of the dummy gate structures 110a, 110b, 110c, and 110d includes a dummy gate dielectric layer 106 and a dummy gate electrode layer 108 formed over the dummy gate dielectric layer 106. The dummy gate dielectric layer 106 and the dummy gate electrode layer 108 may be made of silicon oxide and polysilicon, respectively.

Afterwards, gate spacers 116 are formed on the opposite sidewalls of the dummy gate structures 110a, 110b, 110c, and 110d, in accordance with some embodiments. Each of the gate spacers 116 includes a first spacer layer 111 covering the sidewall of the corresponding dummy gate structure and a second spacer layer 113 covering the sidewall of the first spacer layer 111, as shown in FIGS. 1A and 2A in accordance with some embodiments.

In some embodiments, the second spacer layer 113 is made of a material that is different from that of the first spacer layer 111. The first spacer layer 111 may be made of low-K dielectric materials, silicon oxide, silicon oxynitride, silicon carbide, or another applicable dielectric material. The second spacer layer 113 is made of silicon nitride, silicon carbide, silicon oxynitride, or another applicable material.

After formation of the gate spacers 116, source/drain features 120 are formed in the fin structure 104 laterally adjacent to and exposed from the dummy gate structures 110a, 110b, 110c, and 110d, as shown in FIGS. 1A and 2A in accordance with some embodiments. In some embodiments, the source/drain features 120 is formed by recessing the portions of the fin structure 102 laterally adjacent to the dummy gate structures 110a, 110b, 110c, and 110d and growing semiconductor materials in the formed recesses in the fin structure 102 by performing epitaxial (epi) growth processes. For example, the semiconductor device structure may be an NMOS device, and the source/drain feature 120 may include Si, SiP, SiC, SiPC, or an III-V group semiconductor material (such as InP, GaAs, AlAs, InAs, InAlAs, or InGaAs), or the like. Alternatively, the semiconductor device structure may be a PMOS device, and the source/drain feature 120 may include Si, SiGe, SiGeB, or an III-V group semiconductor material (such as InSb, GaSb, or InGaSb), or the like. The source/drain features 120 protrude above the isolation feature 104, as shown in FIG. 1A.

After the source/drain features 120 are formed, an insulating layer 122 is formed over the fin structure 102 of the substrate 100 and covers the isolation feature 104 and the source/drain features 120, as shown in FIGS. 1B and 2B in accordance with some embodiments. The insulating layer 122 may serve as an interlayer dielectric (ILD) layer) and may be a single layer or include multiple dielectric layers with the same or different dielectric materials. For example, the insulating layer 122 may be a single layer made of silicon oxide, tetraethyl orthosilicate (TEOS), phosphosilicate glass (PSG), borosilicate glass (BSG), boron-doped phosphosilicate Glass (BPSG), fluorosilicate glass (FSG), undoped silicate glass (USG), or the like. The insulating layer 122 may be deposited using any suitable method, such as a chemical vapor deposition (CVD) process, a plasma enhanced CVD (PECVD) process, flowable CVD (FCVD) process, the like, or a combination thereof.

Afterwards, the adjacent dummy gate structures 110a, 110b, 110c, and 110d are removed and replaced by gate structures 130a, 130b, 130c, and 130d, as shown in FIGS. 1B and 2B in accordance with some embodiments. In some embodiments, each of the adjacent gate structures 130a, 130b, 130c, and 130d includes a gate dielectric layer 126, a gate electrode layer 128, and the gate spacers 116. The gate dielectric layer 126 may be made of metal oxides, metal nitrides, metal silicates, transition metal-oxides, transition metal-nitrides, transition metal-silicates, oxynitrides of metals, or other applicable dielectric materials.

In some embodiments, the gate electrode layer 128 is made of a conductive material, such as aluminum, copper, tungsten, titanium, tantalum, or another applicable material. Each of the gate structures 130a, 130b, 130c, and 130d may further include a work functional metal layer (not shown) between the gate dielectric layer 126 and the gate electrode layer 128, so that the gate structures 130a, 130b, 130c, and 130d have the proper work function values. The work function metal layer may be made of TiN, TaN, Ru, Mo, Al, WN, ZrSi$_2$, MoSi$_2$, TaSi$_2$, NiSi$_2$, WN, or a combination thereof. Alternatively, the work function metal layer may be made of Ti, Ag, TaAl, TaAlC, TiAlN, TaC, TaCN, TaSiN, Mn, Zr, or a combination thereof.

The gate structures 130a, 130b, 130c, and 130d are etched to form recesses 140, as shown in FIGS. 1C and 2C in accordance with some embodiments. During the etching, top portions of the gate dielectric layers 130 and the gate spacers 116 are also etched, so that upper sidewalls of the insulating layer 122 are exposed by the recesses 140. In some embodiments, each of the gate electrode layers 128 is further etched after the upper sidewalls of the insulating layer 122 are exposed, so that the recesses 140 are extended to form a T-shaped profile, as shown in FIG. 2C. As a result, the upper surface of each gate spacer 116 and the upper surface of each gate dielectric layer 130 are higher than the upper surface of the corresponding gate electrode layer 128, as shown in FIGS. 1C and 2C.

Afterwards, a conductive capping feature 142 is formed to cover each of the recessed gate electrode layers 128, as shown in FIGS. 1C and 2C in accordance with some embodiments. The conductive capping features 142 and the underlying gate electrode layer 128 form gate stacks of the gate structures 130a, 130b, 130c, and 130d. In some embodiments, the upper surface of each gate spacer 116 is higher than the upper surface of each gate stack, as shown in FIGS. 1C and 2C. The conductive capping features 142 protect the gate electrode layers 122 from damage or loss during subsequent processing. In some embodiments, the conductive capping features 142 are made of a metal material, such as tungsten or fluorine-free tungsten.

After the conductive capping features 142 are formed, a gate cut process is performed to remove one or more gate stacks of the gate structures 130a, 130b, 130c, and 130d in accordance with some embodiments. For example, the gate stack of the gate structure 140c may be removed by etching during the gate cut process, as shown in FIGS. 1C and 2C. Afterwards, an insulating material 129 fills the space that is formed by the removal of the gate stack of the gate structure 130c to form an insulating gate-cut structure 130c' in accordance with some embodiments. The insulating gate-cut structure 130c' includes the gate dielectric layer 126, the insulating material 129, and gate spacers 116 including the first spacer layers 111 and the second spacer layers 113.

The insulating material 129 may include silicon nitride, silicon oxynitride, or silicon carbon nitride, or the like. Alternatively, the insulating material 129 may include hafnium oxide (HfO$_2$), hafnium silicon oxide (HfSiO), hafnium tantalum oxide (HfTaO), hafnium titanium oxide (HfTiO), hafnium zirconium oxide (HfZrO), zirconium oxide, titanium oxide, aluminum oxide, or another applicable dielectric material.

After the insulating gate-cut structure 130c' is formed, insulating capping features 145a, 145b, 145d, and 145c are formed in the recesses 140 (not shown and as indicated in FIGS. 1C and 2C) to respectively cover the upper surfaces of the gate structures 130a, 130b, and 130d, and the insulating gate-cut structure 130c', as shown in FIGS. 1D and 2D in accordance with some embodiments. In some embodiments, an insulating layer (not shown) used for formation of the insulating capping features 145a, 145b, 145c, and 145d is formed over the structure shown in FIGS. 1C and 2C and fills the recesses 140. For example, the insulating layer is made of a material that is different from the material of the insulating layer 122 and includes SiN, SiCN, SiOC, SiON, SiCN, or SiOCN. The insulating layer may be formed by performing a chemical vapor deposition (CVD) process, a plasma enhanced CVD (PECVD) process, low-pressure CVD (LPCVD) process, an atomic layer deposition (ALD) process, or another applicable process. In some embodiments, a polishing process, such as a chemical mechanical polishing (CMP) process, is performed to remove the excess insulating layer above the insulating layer 122. The polishing process is performed on the insulating layer until the insulating layer 122 is exposed and planarized. As a result, the remaining insulating layer forms insulating capping features 145a, 145b, 145c, and 145d, and the upper surfaces of the insulating capping features 145a, 145b, 145c, and 145d are substantially level with the upper surface of the insulating layer 122, as shown in FIGS. 1D and 2D. The insulating capping features 145a, 145b, and 145d serve as etch stop layers and protect the gate structures 130a, 130b, and 130d in the subsequent manufacturing processes (e.g., etching processes).

After the insulating capping features 145a, 145b, 145c, and 145d are formed, a masking layer 150 is formed over the insulating layer 122 and covers the insulating capping features 145a, 145b, 145c, and 145d, as shown in FIG. 2E in accordance with some embodiments. In some embodiments, the masking layer 150 includes a tri-layer resist structure including a bottom layer, a middle layer, and a top layer. In order to simplify the diagram, only a flat layer (i.e., the masking layer 150) is depicted. More specifically, the bottom layer is a first layer of the tri-layer resist structure. The bottom layer may contain a material that is patternable and/or have anti-reflection properties. In some embodiments, the bottom layer is a bottom anti-reflective coating (BARC) layer, such as a nitrogen-free anti-reflective coating (NFARC) layer. In some embodiments, the bottom layer is formed by a spin-on coating process, a chemical vapor deposition (CVD) process, a physical vapor deposition (PVD) process, or another suitable deposition process. The middle layer is formed over the bottom layer and is a second layer of the tri-layer resist structure. The middle layer (which is also referred to as a hard mask layer) provides hard mask properties for the photolithography process. In addition, the middle layer is designed to provide etching selectivity from the bottom layer and the top layer. In some embodiments, the middle layer is made of silicon nitride, silicon oxynitride or silicon oxide and is formed by a spin-on coating process, a chemical vapor deposition (CVD) process, a physical vapor deposition (PVD) process, or another suitable deposition process. The top layer is formed over the middle layer and is a third layer of the tri-layer resist structure. The top layer may be positive photoresist or negative photoresist. In some other embodiments, the tri-layer resist structure includes oxide-nitride-oxide (ONO) layers.

Afterwards, a self-aligned opening 151 is formed through the masking layer 150 and the insulating layer 122 to expose the upper surfaces of some source/drain features 120 between the gate structures 130a and 130d, as shown in FIG. 2F in accordance with some embodiments. In some embodiments, the self-aligned opening 151 is formed by patterning the masking layer 150 and the insulating layer 122 between the insulating capping features 145a and 145d and between the gate structures 130a and 130d. During the patterning of the insulating layer 122, the insulating capping features 145a, 145b, 145c, and 145d are used as etch masks, so as to define source/drain contact regions between the gate structures. For example, the source/drain contact regions are between the gate structures 130a and 130b, between the gate structure 130b and the insulating gate-cut structure 130c', and between the insulating gate-cut structure 130c' and the gate structure 130d. Although some portions of the insulating capping features 145a, 145b, 145c, and 145d may also be removed during etching for formation of the self-aligned opening 151, the gate structures 130a, 130b, and 130d and the insulating gate-cut structure 130c' are still protected by the insulating capping features 145a, 145b, 145c, and 145d.

Afterward, a conductive material 155 is formed over the patterned masking layer 150 and fills the self-aligned opening 151, as shown in FIG. 2G in accordance with some embodiments. In some embodiments, the conductive material 155 is made of Co, W, Ru, Ni, Rh, Al, Mo, Cu, or a metal compound, or the like. The conductive material 155 may be formed by a chemical vapor deposition (CVD) process, a physical vapor deposition, (PVD) process, an atomic layer deposition (ALD) process, an electroless deposition (ELD) process, an electrochemical plating (ECP) process, or another applicable process.

A polishing process is performed to remove the excess conductive material 155, as shown in FIG. 2H in accordance with some embodiments. In some embodiments, the polishing process, such as chemical mechanical polishing (CMP) process, is performed on the conductive material 155 until the insulating capping features 145a, 145b, 145c, and 145d are exposed and planarized.

As a result, the remaining conductive material 155 forms a contact structure 158a between and laterally adjacent to the gate structures 130a and 130b, a contact structure 158b between and laterally adjacent to the gate structure 130b and the insulating gate-cut structure 130c', and a contact structure 158c between and laterally adjacent to the gate structure 130d and the insulating gate-cut structure 130c', as shown in FIG. 2H. Those contact structures 158a, 158b and 158c are electrically connected to the corresponding source/drain features 120 and therefore they are also referred to as self-aligned source/drain contact structures or self-aligned source/drain electrodes. Afterwards, the masking layer 150 is removed.

Afterwards, the contact structures 158a, 158b, and 158c are etched to form recesses that pass through the insulating capping features 145a, 145b, 145c, and 145d, as shown in FIG. 2I in accordance with some embodiments. In some embodiments, portions of the contact structures 158a, 158b, and 158c are etched, so that a recess 161a is formed between the gate structures 130a and 130b, a recess 161b is formed between the gate structure 130b and the insulating gate-cut structure 130c', and a recess 161c is formed between the insulating gate-cut structure 130c' and the gate structure 130d. As a result, the upper surface 159a of contact structure 158a, the upper surface 159b of contact structure 158b, and the upper surface 159c of contact structure 158c are lower than the upper surface 157a of the insulating capping feature 145a, the upper surface 157b of the insulating capping feature 145b, the upper surface 157c of the insulating capping feature 145c, and the upper surface 157d of the insulating capping feature 145d. In some embodiments, the upper surfaces 159a, 159b, and 159c are substantially level with the upper surfaces 142a of the conductive capping features 142.

After the contact structures 158a, 158b, and 158c are recessed, the recesses 161a, 161b, and 161c are widened, as shown in FIG. 2J in accordance with some embodiments. In some embodiments, portions of the insulating capping features 145a, 145b, 145c, and 145d laterally adjacent to the recesses 161a, 161b, and 161c are removed by etching, so as to expose portions of the gate structures 130a, 130b, and 130d and a portion of the insulating gate-cut structure 130c'. The exposed portions of the gate structures 130a, 130b, and 130d and the portion of the insulating gate-cut structure 130c' include the gate spacers 116 (including the first spacer layers 111 and the second spacer layers 113) and the gate dielectric layers 126 on opposite sides of the contact structures 158a, 158b, and 158c. During the etching, portions of the exposed second spacer layers 113 are removed, so that the upper surfaces of the second spacer layers 113 are lower than those of the exposed gate dielectric layers 126 and the exposed first spacer layers 111. As a result, a widened recess 163a is formed between the gate structures 130a and 130b, a widened recess 163b is formed between the gate structure 130b and the insulating gate-cut structure 130c', and a widened recess 163c is formed between the insulating gate-cut structure 130c' and the gate structure 130d, as shown in FIG. 2J.

Afterwards, the gate dielectric layers 126 and the first spacer layers 111 in those widened recesses 163a, 163b, and 163c are recessed and the remaining second spacer layers 113 in those widened recesses 163a, 163b, and 163c are removed, as shown in FIG. 2K in accordance with some embodiments. More specifically, portions of the gate dielectric layers 126 and portions of the first spacer layers 111 in those widened recesses 163a, 163b, and 163c are removed by etching, so that the remaining gate dielectric layers 126 and the remaining first spacer layers 111 have an upper surface that is substantially level with upper surfaces 142a of the conductive capping features 142 (not shown and as indicated in FIG. 2I) and the upper surfaces 159a, 159b, and 159c (not shown and as indicated in FIG. 2I) of the contact structures 158a, 158b, and 158c.

Afterwards, the remaining second spacer layers 113 in those widened recesses 163a, 163b, and 163c are removed by etching, so as to form openings 165a and 165b below the widened recesses 163a, 163b, and 163c and on opposite sides of each of the contact structures 158a, 158b, and 158c, as shown in FIG. 2K in accordance with some embodiments. The openings 165a are respectively formed between the gate structure 130a and the contact structure 158a, between the gate structure 130b and the contact structure 158b, and between the insulating gate-cut structure 130c' and the contact structure 158c. Moreover, the openings 165b are respectively formed between the gate structure 130b and the contact structure 158a, between the insulating gate-cut structure 130c' and the contact structure 158b, and between the gate structure 130d and the contact structure 158c.

After those openings 165a and 165b are formed, insulating capping features are respectively formed in the widened recesses 163a, 163b, and 163c (not shown and as indicated in FIG. 2K) in accordance with some embodiments. More specifically, a capping layer 166 is conformally formed over the structure shown in FIG. 2K to cover the insulating layer 122 and the insulating capping features 145a, 145b, 145c, and 145d, extend on and make direct contact with the sidewalls and the bottom of the widened recesses 163a, 163b, and 163c, and partially fill the openings 165a and 165b (not shown and as indicated in FIG. 2K) as shown in FIG. 2L in accordance with some embodiments. Since the openings 165a and 165b are formed by the removal of the second spacer layers 113, the openings 165a and 165b have a high aspect ratio. Therefore, the openings 165a and 165b may be difficult to be fully filled with the capping layer 166. In some embodiments, the capping layer 166 fills the upper portions of the openings 165a and 165b to cover the opposite upper sidewalls of the contact structures 158a, 158b, and 158c, so that the lower portions of the openings 165a and 165b form air gaps 165c and 165d, respectively, as shown in FIG. 2L. The air gaps 165c are respectively formed between the gate structure 130a and the contact structure 158a, between the gate structure 130b and the contact structure 158b, and between the insulating gate-cut structure 130c' and the contact structure 158c. Moreover, the air gaps 165d are respectively formed between the gate structure 130b and the contact structure 158a, between the insulating gate-cut structure 130c' and the contact structure 158b, and between the gate structure 130d and the contact structure 158c.

Typically, a parasitic capacitor (not shown) may be formed between the gate structure (e.g., the gate structure 130a, 130b, or 130d) and the adjacent contact structure (e.g., the contact structure 158a, 158b, or 158c), causing the performance of the device including the gate structures 130a, 130b, and 130d and the contact structures 158a, 158b, and 158c to suffer. However, air gaps 165c and 165d formed on opposite sides of the contact structures 158a, 158b, and 158c can effectively reduce the capacitance of the parasitic capacitors, thereby improving the device's performance.

In some embodiments, the capping layer 166 is used for formation of the insulating capping features in the widened recesses 163a, 163b, and 163c. In some embodiments, the capping layers 166 has a thickness T that is in a range from about 0.1 nm to about 30 nm. Moreover, the capping layer 166 is made of a material that is different from the material of the insulating capping features 145a, 145b, 145c, and 145d, the material of the gate spacers 116. Therefore, the subsequently formed insulating capping features (which include the capping layer 166) in the widened recesses 163a, 163b, and 163c can provide etch selectivity from the insulating capping features 145a, 145b, 145c, and 145d and/or the gate spacers 116. As a result, such insulating capping features in the widened recesses 163a, 163b, and 163c can provide a hard mask property during the etching of the capping feature 150a, 150b, 150c, or 150d for the formation of a via opening therein.

In some embodiments, the capping layer 166 is made of SiON, $Ta_2O_5$, $Al_2O_3$, or $ZrO_2$. In some other embodiments, the capping layer 166 is made of Al-containing oxide, N-containing oxide, Hf-containing oxide, Ta-containing oxide, Ti-containing oxide, Zr-containing oxide, La-containing oxide, or another metal-containing oxide or high-K (e.g., K>5) dielectric material. The capping layer 166 may be formed by performing a chemical vapor deposition (CVD) process, a plasma enhanced CVD (PECVD) process, low-pressure CVD (LPCVD) process, an atomic layer deposition (ALD) process, or another applicable process.

After the formation of the capping layer 166, a capping layer 168 is formed over the capping layer 166 and fills the widened recesses 163a, 163b, and 163c, as shown in FIG. 2L in accordance with some embodiments. In some embodiments, the capping layer 168 is also used for formation of the insulating capping features in the widened recesses 163a, 163b, and 163c. The capping layer 168 is made of a material that is different from the material of the capping layer 166, so as to provide etch selectivity from the capping layer 166. As a result, the capping layer 166 in the widened recesses 163a, 163b, and 163c can serve an etch stop layer during subsequent formation of one or more via openings over the corresponding source/drain contact structure(s).

In some embodiments, the capping layer 168 is made of made of silicon oxide, tetraethyl orthosilicate (TEOS), phosphosilicate glass (PSG), borosilicate glass (BSG), boron-doped phosphosilicate Glass (BPSG), fluorosilicate glass (FSG), undoped silicate glass (USG), or the like. The insulating layer 160 may be formed by performing by any suitable deposition method, such as a chemical vapor deposition (CVD) process, a plasma enhanced CVD (PECVD) process, flowable CVD (FCVD) process, physical vapor deposition, (PVD), atomic layer deposition (ALD), spin-on coating, the like, or a combination thereof.

Afterwards, a polishing process, such as a chemical mechanical polishing (CMP) process, is performed to remove the excess capping layers 166 and 168, as shown in FIG. 2M in accordance with some embodiments. The polishing process is performed on the capping layers 168 and 166 until the upper surfaces of the gate spacers 116 that are not laterally adjacent to the contact structures 158a, 158b, and 158c are exposed. The remaining capping layers 166 and 168 form insulating capping features 170a, 170b, and 170c, as shown in FIG. 2M. In some embodiments, the insulating capping feature 170a is in direct contact with the insulating capping features 145a and 145b, the insulating capping feature 170b is in direct contact with the insulating capping features 145b and 145c, and the insulating capping feature 170c is in direct contact with the insulating capping features 145c and 145d. In some embodiments, the upper surfaces of the insulating capping features 145a, 145b, 145c, and 145d are substantially level with the upper surfaces of the formed insulating capping features 170a, 170b, and 170c. The insulating capping features 170a, 170b, and 170c respectively cover and are in contact with the upper surfaces 159a, 159b, and 159c (not shown and as indicated in FIG. 2I) of the contact structures 158a, 158b, and 158c. In some embodiments, the insulating capping features 170a, 170b, and 170c have a height H that is equal to the thickness of the insulating capping features 145a, 145b, 145c, and 145d. The height H may be in a range from about 0.1 nm to about 50 nm.

In each of the insulating capping features 170a, 170b, and 170c, the capping layer 166 has an H-shaped profile, so that the opposite sidewalls and the bottom of the capping layers 168 and the opposite upper sidewalls of the corresponding contact structure (e.g., the contact structure 158a, 158b, or 158c) are covered by the capping layers 166. The capping layers 168 in each of the insulating capping features 170a, 170b, and 170c serves as an etch stop layer in the subsequent manufacturing processes (e.g., etching processes).

In some embodiments, each of the air gaps 165c is surrounded by the fin structure 102 (not shown and as indicated in FIG. 2B), the corresponding insulating capping feature (e.g., the insulating capping feature 170a, 170b, or 170c), the corresponding contact structure (e.g., the contact structure 158a, 158b, or 158c), and the corresponding first spacer layer 111. Similarly, each of the air gaps 165d is surrounded by the fin structure 102, the corresponding insulating capping feature (e.g., the insulating capping feature 170a, 170b, or 170c), the corresponding contact structure (e.g., the contact structure 158a, 158b, or 158c), and the corresponding first spacer layer 111. Therefore, the insulating capping features 170a, 170b, and 170c and the air gaps 165c and 165d separate the contact structures 158a, 158b, and 158c from the gate structures 130a, 130b, and 130c.

After the insulating capping features 170a, 170b, and 170c are formed, an insulating layer 172 is formed over and covers the insulating layer 122, the insulating capping features 145a, 145b, 145c, 145d, 170a, 170b, and 170c, as shown in FIG. 2N in accordance with some embodiments. The insulating layer 172 may include a single layer or multilayers and is made of $SiO_2$, SiOC, $ZrO_2$, $HfO_2$, or another applicable dielectric material, or a combination thereof. The insulating layer 172 may serve as an interlayer dielectric (ILD) layer. In some embodiments, the insulating layer 172 is made of a material that is the same as the material of the insulating layer 122. In some embodiments, the insulating layer 172 is made of a material that is the same as that of the capping layer 168 and different from the material of the capping layer 166. For example, the insulating layer 172 is made of silicon oxide, tetraethyl orthosilicate (TEOS), phosphosilicate glass (PSG), borosilicate glass (BSG), boron-doped phosphosilicate Glass (BPSG), fluorosilicate glass (FSG), undoped silicate glass (USG), or the like. The insulating layer 172 may be formed by performing by any suitable deposition method, such as a chemical vapor deposition (CVD) process, a plasma enhanced CVD (PECVD) process, flowable CVD (FCVD) process, physical vapor deposition, (PVD), atomic layer deposition (ALD), spin-on coating, the like, or a combination thereof.

Afterwards, a via opening 173 that passes through the insulating layer 172 and the insulating capping feature 145a is formed, so as to expose the upper surface 142a (not shown and as indicated in FIG. 2I) of the conductive capping feature 142 in the gate structure 130a, as shown in FIG. 2O in accordance with some embodiments. In some embodiments, the via opening 173 corresponding to the gate structure 130a is formed by performing photolithography and etching processes. For example, an etching process may be performed in the insulating layer 172 using the insulating capping feature 145a as an etch stop layer, so that an opening through the insulating layer 172 is formed to expose a portion of the insulating capping feature 145a.

Afterwards, the exposed portion of the insulating capping feature 145a is etched, so as to extend the via opening 173 and expose the upper surface of the gate structure 130a (e.g., the upper surface 142a of the conductive capping feature 142 in the gate structure 130a). During the etching of the via opening 173, the capping layer 166 of the insulating capping feature 170a provides a hard mask property to prevent the contact structure 158a laterally adjacent to the gate structure 130a from being damaged. As a result, the formed via opening 173 can be self-aligned to the conductive capping feature 142 in the gate structure 130a. Moreover, the source/drain contact structure (i.e., the contact structure 158a) can be prevented from being bridged with the subsequent via structure in the via opening 173 even if misalignment occurs in formation of the via opening 173.

Afterwards, a via opening 175 that passes through the insulating layer 172 and the insulating capping feature 175c (not shown and as indicated in FIG. 2O) and a via trench opening 177 that passes through the insulating layer 172 and the insulating capping feature 175b (not shown and as indicated in FIG. 2O) are formed, as shown in FIG. 2P in accordance with some embodiments.

In some embodiments, the upper surface 159c (not shown and as indicated in FIG. 2I) of the contact structure 158c is exposed through the via opening 175. Also, the upper surface 159b (not shown and as indicated in FIG. 2I) of the contact structure 158b is exposed through the via trench opening 177. In some embodiments, the via opening 173, the via opening 175, and the via trench opening 177 may have the same depth. Therefore, the subsequently formed via structures respectively in the via opening 173, the via opening 175, and the via trench opening 177 have the same vertical height.

The via opening 175 and the via trench opening 177 respectively corresponding to the contact structures 158c and 158b are simultaneously formed by the same photolithography and etching processes in accordance with some embodiments. In some other embodiments, the via opening 175 and the via trench opening 177 may be formed by respective photolithography and etching processes.

Although the via opening 173 is formed prior to formation of the via opening 175 and the via trench opening 177, the via opening 175 and the via trench opening 177 may be formed prior to formation of the via opening 173, in accordance some other embodiments.

Afterwards, a conductive material 180 is formed over the insulating layer 172 and fills the via openings 173 and 175 and the via trench opening 177, as shown in FIG. 2Q in accordance with some embodiments. In some embodiments, the conductive material 180 is made of Co, W, Ru, Ni, Rh, Al, Mo, Cu, or a metal compound, or the like. The conductive material 180 may be formed by a chemical vapor deposition (CVD) process, a physical vapor deposition, (PVD) process, an atomic layer deposition (ALD) process, an electroless deposition (ELD) process, an electrochemical plating (ECP) process, or another applicable process.

Afterwards, a polishing process, such as a chemical mechanical polishing (CMP) process, is performed on the conductive material 180 until the upper surface of the insulating layer 172 is exposed, in accordance with some embodiments. In some other embodiments, the exposed insulating layer 172 and the remaining conductive material 180 are further polished until the desired thickness of the insulating layer 172 is obtained, as shown in FIG. 2R.

After the polishing process, the remaining conductive material 180 in the via openings 173 and 175, and the via trench opening 177 forms conductive via structures 192, 194, and 196. As a result, the semiconductor device structure 10a having the gate structures 130a, 130b, and 130d, the contact structures 158a, 158b, and 158c with insulating caps (e.g., insulating capping features 170a, 170b, and 170c), and the via structures 192, 194, and 196 is formed.

In some embodiments, the via structure 192 is formed in and surrounded by the insulating layer 172 and the insulating capping feature 145a and electrically connected to the gate structure 130a via the conductive capping feature 142 that is formed between the gate electrode layer 128 and the via structure 192. Moreover, the via structure 194 and the via structure 196 are formed in and surrounded by the insulating layer 172 and respectively and electrically connected to the contact structures 158c and 158b. The via structure 196 covers the contact structure 158b, the gate structure 130b, and the insulating gate-cut structure 130c'. In some embodiments, the via structures 192, 194, and 196 have upper surfaces that are substantially level with the upper surface of the insulating layer 172, as shown in FIG. 2R.

Since the insulating capping feature 145a and the capping layers 166 in the insulating capping features 170a, 170b, and 170c can serve as etch stop layers during the formation of via openings 173 and 175 and the via trench opening 177 (not shown and as indicated in FIG. 2P) in the insulating layer 172, there is no need to form an etch stop layer between the insulating layer 172 and insulating capping features 145a, 175a, 175b, and 175c. As a result, the etching for the definition of via openings 173 and 175 and the via trench opening 177 can be simplified. In addition, since such an etch stop layer is omitted and the insulating layer 172 is thinned to the desired thickness, the height of the formed via structures 194 and 196 can be reduced. As a result, the resistances of the via structures 194 and 196 can be reduced to improve the device's performance.

Figure 3:
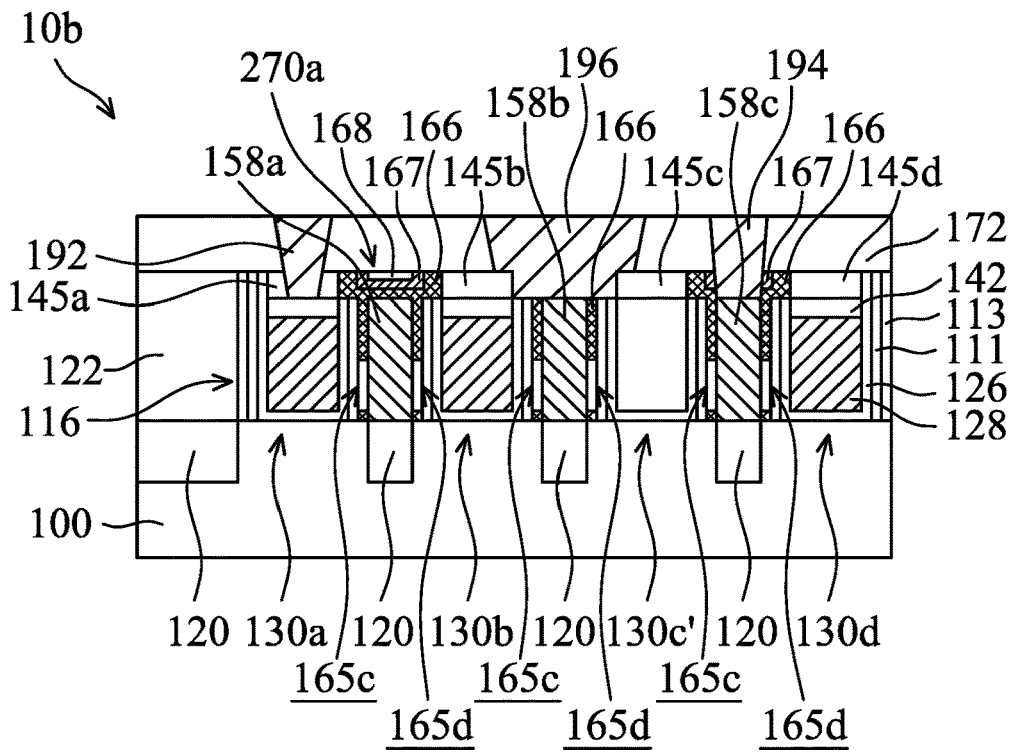
FIG. 3 illustrates a cross-sectional representation of a semiconductor device structure in accordance with some embodiments.

Many variations and/or modifications can be made to embodiments of the disclosure. FIG. 3 shows a cross-sectional representation of a semiconductor device structure 10b, in accordance with some embodiments. The semiconductor device structure 10b shown in FIG. 3 is similar to the semiconductor device structure 10a shown in FIG. 2R. In some embodiments, the materials, formation methods, and/or benefits of the semiconductor device structure 10a shown in FIGS. 2A to 2R may also be applied in the embodiments illustrated in FIG. 3, and are therefore not repeated.

Unlike the insulating capping feature 170a in the semiconductor device structure 10a shown in FIG. 2R, the insulating capping feature 270a in the semiconductor device structure 10b shown in FIG. 3 further includes a capping layer 167 formed between the capping layer 166 and the capping layer 168, in accordance with some embodiments. In some embodiments, the formation of the insulating capping feature 270a includes successively and conformally forming the capping layers 166 and 167 in the widened recess 163a (not shown and as indicated in FIG. 2L). Afterwards, the capping layer 168 is formed over the capping layer 167 in the widened recess 163a, so that the opposite sidewalls and the bottom of the capping layer 168 are covered by the capping layers 167 and 166.

In some embodiments, the capping layers 166, 167, and 168 are made of different materials. In some embodiments, the material of the capping layer 167 includes SiON, Ta$_2$O$_5$, Al$_2$O$_3$, or ZrO$_2$, Al-containing oxide, N-containing oxide, Hf-containing oxide, Ta-containing oxide, Ti-containing oxide, Zr-containing oxide, La-containing oxide, or another metal-containing oxide or high-K (e.g., K>5) dielectric material.

Figure 4:
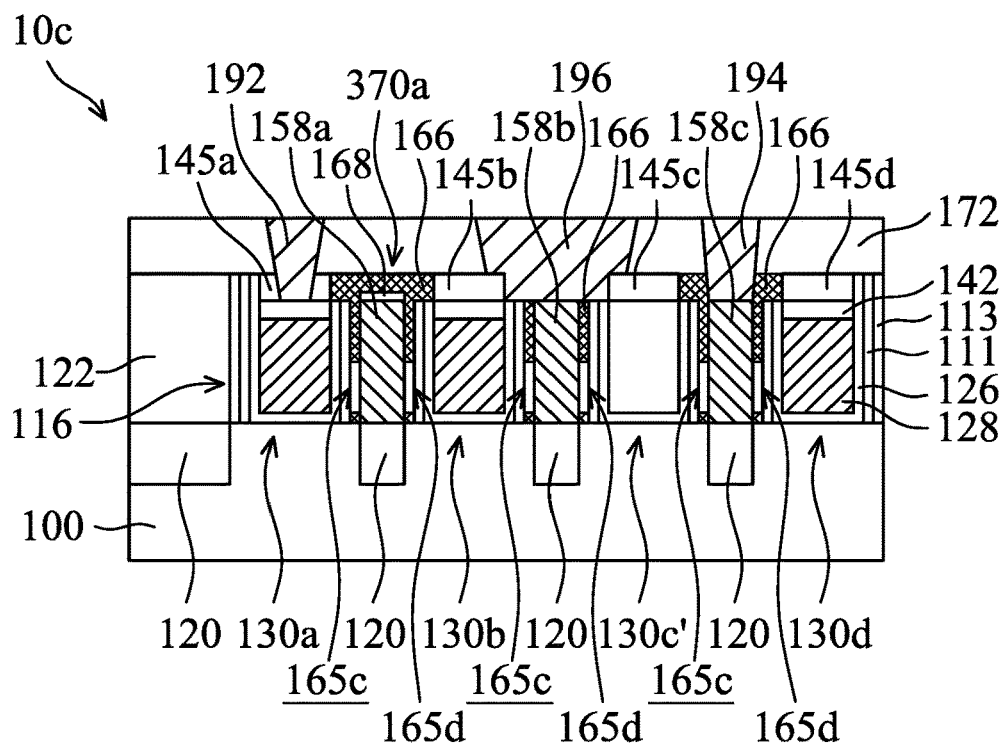
FIG. 4 illustrates a cross-sectional representation of a semiconductor device structure in accordance with some embodiments.

FIG. 4 shows a cross-sectional representation of a semiconductor device structure 10c, in accordance with some embodiments. The semiconductor device structure 10c shown in FIG. 4 is similar to the semiconductor device structure 10a shown in FIG. 2R. In some embodiments, the materials, formation methods, and/or benefits of the semiconductor device structure 10a shown in FIGS. 2A to 2R may also be applied in the embodiments illustrated in FIG. 4, and are therefore not repeated.

Unlike the insulating capping feature 170a in the semiconductor device structure 10a shown in FIG. 2R, the capping layer 166 in the insulating capping feature 370a in the semiconductor device structure 10c shown in FIG. 4 has a reversed U-shaped profile, in accordance with some embodiments. The reversed U-shaped capping layer 166 covers the opposite upper sidewalls of the capping layer 168 and extends between the capping layer 168 and the insulating layer 172 to cover the top of the capping layer 168, in accordance with some embodiments. In some embodiments, the formation of the insulating capping feature 370a includes forming the capping layer 168 on the opposite upper sidewalls of the contact structure 158a and in the widened recess that are formed between the insulating capping features 145a and 145b. Afterwards, the reversed U-shaped capping layer 166 is formed over the capping layer 168 in the widened recess, so that the opposite sidewalls and the top of the capping layer 168 are covered by the capping layer 166.

Figure 5:
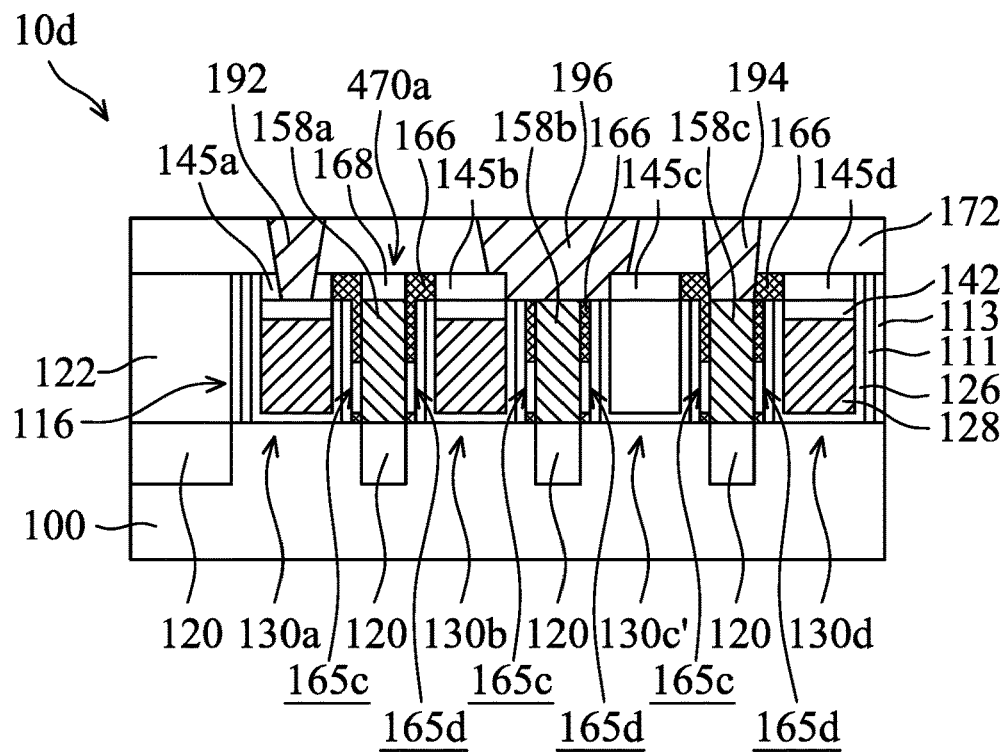
FIG. 5 illustrates a cross-sectional representation of a semiconductor device structure in accordance with some embodiments.

FIG. 5 shows a cross-sectional representation of a semiconductor device structure 10d, in accordance with some embodiments. The semiconductor device structure 10d shown in FIG. 5 is similar to the semiconductor device structure 10a shown in FIG. 2R. In some embodiments, the materials, formation methods, and/or benefits of the semiconductor device structure 10a shown in FIGS. 2A to 2R may also be applied in the embodiments illustrated in FIG. 5, and are therefore not repeated.

Unlike the insulating capping feature 170a in the semiconductor device structure 10a shown in FIG. 2R, the capping layer 166 in the insulating capping feature 470a in the semiconductor device structure 10d shown in FIG. 5 covers the opposite sidewalls of the capping layer 168 and does not cover the bottom and top of the capping layer 168, in accordance with some embodiments. As a result, the upper surface 159 (not shown and as indicated in FIG. 2I) of the contact structure 158a is separated from the insulating capping layers 145a and 145b by the capping layer 166 in the insulating capping feature 470a. In some embodiments, the capping layer 166 has an upper surface that is substantially level with an upper surface of the capping layer 168 and forms spacers on opposite sidewalls of the capping layer 168. In some embodiments, the formation of the insulating capping feature 470a includes forming the capping layer 166 on the opposite upper sidewalls of the contact structure 158a and conformally covering the widened recess that is formed between the insulating capping features 145a and 145b. Afterwards, the capping layer 166 on the bottom of each of the widened recess is removed to leave the capping layer 166 on the opposite sidewalls of the widened recess and the opposite upper sidewalls of the contact structure 158a. Afterwards, the widened recess is filled with the capping layer 168, so that the opposite sidewalls of the capping layer 168 are covered by the capping layer 166.

Figure 6:
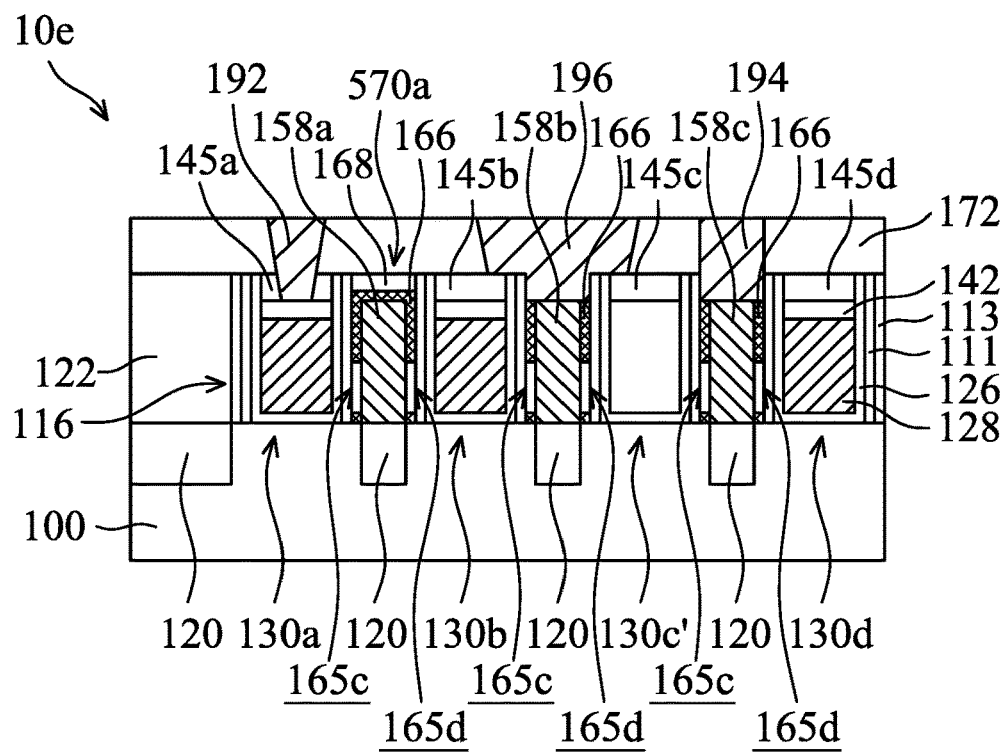
FIG. 6 illustrates a cross-sectional representation of a semiconductor device structure in accordance with some embodiments.

FIG. 6 shows a cross-sectional representation of a semiconductor device structure 10e, in accordance with some embodiments. The semiconductor device structure 10e shown in FIG. 6 is similar to the semiconductor device structure 10a shown in FIG. 2R. In some embodiments, the materials, formation methods, and/or benefits of the semiconductor device structure 10a shown in FIGS. 2A to 2R may also be applied in the embodiments illustrated in FIG. 6, and are therefore not repeated.

Unlike the insulating capping feature 170a in the semiconductor device structure 10a shown in FIG. 2R, the capping layer 166 in the insulating capping feature 570a in the semiconductor device structure 10e shown in FIG. 6 has a reversed U-shaped profile, in accordance with some embodiments. In some embodiments, the reversed U-shaped capping layer 166 is formed between the capping layer 168 and the contact structure 158a and extends on the opposite upper sidewalls of the contact structure 158a, so as to cover the upper surface of the contact structure 158a. In some embodiments, the formation of the insulating capping feature 570a includes forming the capping layer 166 in the widened recess to cover the opposite upper sidewalls and the top of the contact structure 158a. Afterwards, a capping layer 168 is formed over the capping layer 166 in the widened recess.

Figure 7:
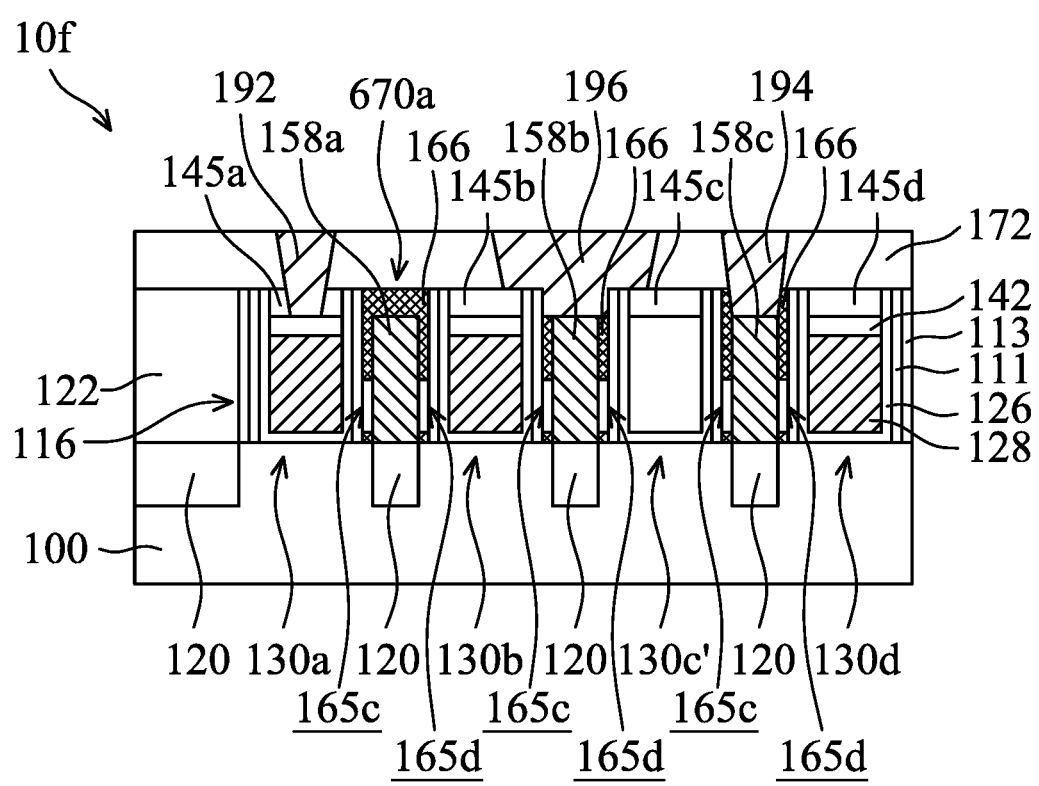
FIG. 7 illustrates a cross-sectional representation of a semiconductor device structure in accordance with some embodiments.

FIG. 7 shows a cross-sectional representation of a semiconductor device structure 10f, in accordance with some embodiments. The semiconductor device structure 10f shown in FIG. 7 is similar to the semiconductor device structure 10a shown in FIG. 2R. In some embodiments, the materials, formation methods, and/or benefits of the semiconductor device structure 10a shown in FIGS. 2A to 2R may also be applied in the embodiments illustrated in FIG. 7, and are therefore not repeated.

Unlike the insulating capping feature 170a in the semiconductor device structure 10a shown in FIG. 2R, the insulating capping feature 670a in the semiconductor device structure 10f shown in FIG. 7 is formed of the capping layer 166, in accordance with some embodiments. In some embodiments, the insulating capping feature 670a formed of the capping layer 166 fills the recess between the insulating capping features 145a and 145b and covers the opposite upper sidewalls of the contact structure 158a. Moreover, the first spacer layers 111 of the gate spacers 116 between the gate structures 130a and 130b protrude above the upper surface of the contact structures 142 of the gate structures 130a and 130b. As a result, the first spacer layers 111 are formed between the insulating capping features 145a and 670a and between the insulating capping features 145b and 670a. Therefore, the insulating capping feature 670a is separated from the insulating capping features 145a and 145b by the gate spacers (e.g., the first spacer layers 111).

Embodiments of semiconductor device structures and methods for forming the same are provided. The formation of the semiconductor device structure includes forming an insulating capping feature over a contact structure that is laterally adjacent to a gate stack. The insulating capping feature covers an upper surface and an upper sidewall of the contact structure, so as to form an air gap between the gate stack and a lower sidewall of the contact structure. Afterwards, an insulating layer covers the insulating capping feature. The insulating capping feature serves as a hard mask during the definition of a via opening in the insulating layer above the gate stack, thereby providing good isolation between the contact structure and the subsequently formed via structure over the gate stack. Therefore, the contact structure can be prevented from being bridged with the subsequently formed via structure. The insulating capping feature can also serve as an etch stop layer during the definition of via opening in the insulating layer above the contact structure. Therefore, there is no need to form an etch stop layer between the insulating layer and the insulating capping feature. As a result, the etching for the definition of via openings can be simplified. The height of the subsequently formed via structures can be reduced, thereby reducing the resistances of the via structures to improve the device's performance. In addition, since the air gap is formed between the gate stack and the contact structure, the capacitance of the parasitic capacitor formed between the gate stack and the contact structure can be reduced, thereby further improving the device's performance.

In some embodiments, a semiconductor device structure is provided. The semiconductor device structure includes a gate stack formed over a semiconductor substrate, and a source/drain contact structure formed over the semiconductor substrate and laterally adjacent to the gate stack. The semiconductor device structure also includes a first insulating capping feature covering an upper surface and an upper sidewall of the source/drain contact structure, so that an air gap is formed between the gate stack and a lower sidewall of the source/drain contact structure. The semiconductor device structure also includes an insulating layer formed over the gate stack and the first insulating capping feature, and a via structure passing through the insulating layer and electrically connected to the gate stack.

In some embodiments, a semiconductor device structure is provided. The semiconductor device structure includes a fin structure over a semiconductor substrate, and a gate structure across the fin structure. The gate structure includes a gate electrode layer, a conductive capping feature formed over the gate electrode layer, and a gate spacer covering sidewalls of the gate electrode layer and the conductive capping feature. The semiconductor device structure also includes a contact structure formed over the fin structure and laterally adjacent to the gate structure. The semiconductor device structure also includes an insulating layer formed over the gate structure and the contact structure, and a first insulating capping feature formed between the insulating layer and the contact structure to cover an upper surface and an upper sidewall of the contact structure. An air gap is surrounded by the fin structure, the first insulating capping feature, the gate spacer, and a lower sidewall of the contact structure. The semiconductor device structure also includes a via structure passing through the insulating layer and electrically connected to the conductive capping feature.

In some embodiments, a method for forming a semiconductor device structure is provided. The method includes forming a first insulating layer over a semiconductor substrate having a fin structure and forming adjacent first gate structure and second gate structure in the first insulating layer and across the fin structure. Each of the first gate structure and the second gate structure includes a gate stack, a first spacer layer covering a sidewall of the gate stack, and a second spacer layer covering a sidewall of the first spacer layer. The method also includes forming a contact structure between the first gate structure and the second gate structure and removing the second spacer layers to form a first opening between the first spacer layer of the first gate structure and the contact structure and a second opening between the first spacer layer of the second gate structure and the contact structure. The method also includes forming an insulating capping feature to cover an upper surface of the contact structure and to fill upper portions of the first opening and the second opening, so that a lower portion of each of the first opening and the second opening form an air gaps. The method also includes forming a second insulating layer over the first insulating layer and covering the insulating capping feature and forming a via structure passing through the second insulating layer and electrically connected to the gate stack.

The fins described above may be patterned by any suitable method. For example, the fins may be patterned using one or more photolithography processes, including double-patterning or multi-patterning processes. Generally, double-patterning or multi-patterning processes combine photolithography and self-aligned processes, allowing patterns to be created that have, for example, pitches smaller than what is otherwise obtainable using a single, direct photolithography process. For example, in one embodiment, a sacrificial layer is formed over a substrate and patterned using a photolithography process. Spacers are formed alongside the patterned sacrificial layer using a self-aligned process. The sacrificial layer is then removed, and the remaining spacers may then be used to pattern the fins.

The foregoing outlines features of several embodiments so that those skilled in the art may better understand the aspects of the present disclosure. Those skilled in the art should appreciate that they may readily use the present disclosure as a basis for designing or modifying other processes and structures for carrying out the same purposes and/or achieving the same advantages of the embodiments introduced herein. Those skilled in the art should also realize that such equivalent constructions do not depart from the spirit and scope of the present disclosure, and that they may make various changes, substitutions, and alterations herein without departing from the spirit and scope of the present disclosure.

What is claimed is:
1. A semiconductor device structure, comprising:
a gate stack formed over a semiconductor substrate;
a source/drain contact structure formed over the semiconductor substrate and laterally adjacent to the gate stack;
a first insulating capping feature covering an upper surface and an upper sidewall of the source/drain contact structure, so that an air gap is formed between the gate stack and a lower sidewall of the source/drain contact structure, wherein the lower sidewall of the source/drain contact structure is in direct contact with the air gap;
an insulating layer formed over the gate stack and the first insulating capping feature; and
a via structure passing through the insulating layer and electrically connected to the gate stack.

2. The semiconductor device structure as claimed in claim 1, further comprising:
a gate spacer covering a sidewall of the gate stack and separated from the source/drain contact structure by the first insulating capping feature and the air gap; and
a second insulating capping feature covering an upper surface of the gate stack and covered by the insulating layer,
wherein the second insulating capping feature comprises a material that is different from a material of the first insulating capping feature.

3. The semiconductor device structure as claimed in claim 2, wherein the upper surface of the gate stack is substantially level with the upper surface of the source/drain contact structure, and wherein an upper surface of the first insulating capping feature is substantially level with an upper surface of the second insulating capping feature.

4. The semiconductor device structure as claimed in claim 1, wherein the first insulating capping feature comprises:
a first capping layer; and
a second capping layer covering opposite sidewalls of the first capping layer and the upper sidewall of the source/drain contact structure.

5. The semiconductor device structure as claimed in claim 4, wherein the second capping layer extends to a bottom of the first capping layer.

6. The semiconductor device structure as claimed in claim 4, wherein the first insulating capping feature further comprises:
a third capping layer formed between the first capping layer and the second capping layer,
wherein the third capping layer covers the opposite sidewalls and a bottom of the first capping layer.

7. The semiconductor device structure as claimed in claim 4, wherein the second capping layer extends to a top of the first capping layer.

8. The semiconductor device structure as claimed in claim 1, wherein the first insulating capping feature comprises:
a first capping layer; and
a second capping layer formed between the first capping layer and the source/drain contact structure and extending on the upper sidewall of the source/drain contact structure.

9. A semiconductor device structure, comprising:
a fin structure over a semiconductor substrate;
a gate structure across the fin structure, comprising:
a gate electrode layer;
a conductive capping feature formed over the gate electrode layer; and
a gate spacer covering sidewalls of the gate electrode layer and the conductive capping feature;
a contact structure formed over the fin structure and laterally adjacent to the gate structure;
an insulating layer formed over the gate structure and the contact structure;
a first insulating capping feature formed between the insulating layer and the contact structure to cover an upper surface and an upper sidewall of the contact structure, wherein an air gap is surrounded by the fin structure, the first insulating capping feature, the gate spacer, and a lower sidewall of the contact structure; and
a via structure passing through the insulating layer and electrically connected to the conductive capping feature.

10. The semiconductor device structure as claimed in claim 9, further comprising:
a second insulating capping feature covering an upper surface of the conductive capping feature and covered by the insulating layer,
wherein the second insulating capping feature comprises a material that is different from a material of the first insulating capping feature.

11. The semiconductor device structure as claimed in claim 10, wherein the first insulating capping feature is separated from the second insulating capping feature by the gate spacer.

12. The semiconductor device structure as claimed in claim 9, wherein the first insulating capping feature comprises:
a first capping layer; and
a second capping layer covering the upper sidewall of the contact structure and opposite sidewalls and a bottom of the first capping layer.

13. The semiconductor device structure as claimed in claim 12, wherein the first insulating capping feature further comprises:
a third capping layer formed between the first capping layer and the second capping layer.

14. The semiconductor device structure as claimed in claim 9, wherein the first insulating capping feature comprises:
a first capping layer; and
a second capping layer covering the upper sidewall of the contact structure and opposite sidewalls and a top of the first capping layer.

15. The semiconductor device structure as claimed in claim 9, wherein the first insulating capping feature comprises:
a first capping layer; and
a second capping layer covering the upper sidewall of the contact structure and opposite sidewalls of the first capping layer,
wherein the upper surface of the contact structure is separated from the second capping layer by the first capping layer.

16. The semiconductor device structure as claimed in claim 9, wherein the second insulating capping feature comprises:
a first capping layer; and
a second capping layer formed below the first capping layer and covering the upper sidewall and an upper surface of the contact structure.

17. A semiconductor device structure, comprising:
a gate stack and a source/drain contact structure over a fin structure extending from a semiconductor substrate;
a gate spacer between the gate stack and the source/drain contact structure;
a first insulating capping feature comprising:
a first portion covering upper surfaces of the source/drain contact structure and the gate spacer; and
a second portion extending between an upper sidewall of the gate spacer and an upper sidewall of the source/drain contact structure, so that an air gap is formed below the second portion of the first insulating capping feature to separate a lower sidewall of the gate spacer from a lower sidewall of the source/drain contact structure; and a second insulating capping feature covering an upper surface of the gate stack and in direct contact with the first portion of the first insulating capping feature.

18. The semiconductor device structure as claimed in claim 17, wherein the first insulating capping feature comprises:

a first capping layer; and a second capping layer covering opposite sidewalls of the first capping layer and the upper sidewall of the source/drain contact structure.

19. The semiconductor device structure as claimed in claim 18, wherein the second insulating capping feature further comprises:

a third capping layer formed between the first capping layer and the second capping layer, wherein the third capping layer covers the opposite sidewalls and a bottom of the first capping layer.

20. The semiconductor device structure as claimed in claim 17, wherein the second insulating capping feature comprises:

a first capping layer; and a second capping layer formed between the first capping layer and the source/drain contact structure and extending on the upper sidewall of the source/drain contact structure.

* * * * *